US006482569B1

(12) United States Patent
Matsuoka et al.

(10) Patent No.: US 6,482,569 B1
(45) Date of Patent: Nov. 19, 2002

(54) PROCESS FOR FORMING A POLYIMIDE PATTERN WITH PHOTOSENSITIVE COMPOSITION FOR I-LINE STEPPER

(75) Inventors: Yoshio Matsuoka, Fuji (JP); Kanichi Yokota, Fuji (JP); Yasuhiro Kataoka, Fuji (JP)

(73) Assignee: Asahi Kasei Kabushiki Kaisha (JP)

( * ) Notice: Subject to any disclaimer, the term of this patent is extended or adjusted under 35 U.S.C. 154(b) by 0 days.

(21) Appl. No.: 09/572,203

(22) Filed: May 17, 2000

Related U.S. Application Data

(63) Continuation of application No. 08/451,616, filed on May 26, 1995, now Pat. No. 6,162,580, which is a continuation of application No. 08/095,783, filed on Jul. 21, 1993, now abandoned.

(30) Foreign Application Priority Data

Jul. 22, 1992 (JP) .............................. 4-215732

(51) Int. Cl.$^7$ ................................. G03C 1/73
(52) U.S. Cl. ..................... 430/283.1; 430/325; 430/326
(58) Field of Search .............................. 430/283.1, 325, 430/326

(56) References Cited

U.S. PATENT DOCUMENTS 4,927,736 A * 5/1990 Mueller et al. ............. 430/176
5,019,482 A * 5/1991 Ai et al. .................. 430/283.1
5,037,720 A * 8/1991 Khanna ...................... 430/168
5,399,462 A * 3/1995 Sachdev et al. ............ 430/323

FOREIGN PATENT DOCUMENTS

EP          0 254 230        *  1/1988

OTHER PUBLICATIONS

Communication from the European Patent Office in the matter of EP 0 580 108, a Declaration on Dec. 5, 1997.*

Supplemental Communication from the European Patent Office, Declaration Dec. 22, 1999.*

* cited by examiner

*Primary Examiner*—Laura Weiner
(74) *Attorney, Agent, or Firm*—Pennie & Edmonds LLP

(57) ABSTRACT

The present invention provides photosensitive compositions which comprise polyimide precursors having a chemical structure selected from several specific chemical structures and/or specific amide bond density and are adjusted so that the film obtained by applying and drying the composition may exhibit a specific absorbance to light. The polyimide film obtained by heat-curing the above photosensitive composition exhibits excellent physical properties and water resistance, and has high adhesive strength to epoxy resins, inorganic materials and metals.

2 Claims, No Drawings

US 6,482,569 B1

PROCESS FOR FORMING A POLYIMIDE PATTERN WITH PHOTOSENSITIVE COMPOSITION FOR I-LINE STEPPER

This is a continuation of application Ser. No. 08/451,616, filed May 26, 1995, now U.S. Pat. No. 6,162,580 which is a continuation of application Ser. No. 08/095,783, filed Jul. 21, 1993, now abandoned.

BACKGROUND OF THE INVENTION

1. Field of the Invention

The present invention relates to a novel photosensitive composition suitably used to manufacture semiconductor devices or multilayer circuit boards in the field of electric and electronics. Particularly, this invention relates to a photosensitive composition applicable to a lithography process with a short wavelength light source in order to obtain polyimide patterns after annealing. Such a composition is becoming popular in the production process of semiconductors.

2. Prior Art

Polyimides have been recognized as a material used in the field of electronics for their high thermal and chemical stabilities, low dielectric constant and excellent ability in planarization. These polyimides have been widely used as materials for surface protective layers, interlayer dielectrics of semiconductors and insulating layers in multichip modules.

In order to obtain a desired pattern from ordinary polyimide coatings, an indirect lithographic method wherein, for example, a polyimide layer with patterned photoresist as an etching mask is etched is employed. In this method, however, the process is complicated. Moreover, the method has drawbacks such as the use of harmful agents like hydrazine is required in the etching process and the resolution of the polyimide pattern is reduced because of the indirect lithographic method.

Accordingly, investigations into methods for direct pattern formation of polyimides with photoreactive compounds having polyimides or polyimide precursors have been conducted. In such methods, the polyamic acid derivatives having double bonds linked through ester bonds, amide bonds, acid ammonium salt and the like are used. The polyamic acid derivatives can be used in the direct photolithography process with photo initiators. The photosensitive components are removed by heating to obtain thermally stable polyimides (T. Yamaoka and T. Omote, "Polyfile", vol.27, no.2, pp.14–18 (1990)). This technology is generally referred to as a photosensitive polyimide technology.

A demand for accumulation of semiconductors such as IC, LSI, VLSI has been gradually increasing. According to this demand, processing technologies for fine materials has been expected. In one of the technologies, the pattern formation of photoresists is conducted by using short wavelength light such as i-line light of Hg lamp (365 nm wavelength) instead of ordinary G-line light (436 nm wavelength), for which a high resolution can be expected. It has been anticipated that all exposure apparatus will employ i-line light at semiconductor munufacturing factories in the near future.

On the other hand, in the case of conventional polyimide precursor technology, the compositions to be used in this technology have relatively high absorbance to i-line light. Further, the polyimide precursor compositions are applied to be rather thick, that is, 12 $\mu$m or more, in view of the shrinkage caused by removing the photosensitive components during curing, because the polyimide coating requires 6 $\mu$m thick or more from the standpoint of the physical properties. Therefore, conventional polyimide precursor compositions do not allow i-line light to reach the bottom of its coating. As a result, the bottom of the coating is not sufficiently hardened by exposure and the pattern is washed away in development. Consequently, i-line light is not suitable for the exposure light source for obtaining a polyimide coating having more than a certain thickness. (C. Schuoket, et al., "IEEE/SEMI Advanced Semiconductor Manufacturing Conference", pp.72–74 (1990))

When i-line light is used, a pattern formation of thin coatings must be conducted several times to obtain sufficiently thick polyimide coating, so that the accuracy of the resultant patterns cannot be improved and the production process becomes complicated. Therefore, i-line light exposure is not practical.

It has been known that a film of a fluorine-containing polyimide precursor has high i-line light trasmittancy (T. Omote, T. Yamaoka and K. Kosei, "Journal of Applied Polymer Sience", vol.38, pp.389–402 (1989)). Polyimides, which are obtained by heat-curing the precursors and contain fluorine in their main frame work, have drawbacks in practical use. That is, they have a low adhesive strength to other materials used with polyimides, such as base inorganic materials, epoxy resins in coating layers and metals for distributing wires when they are used for semiconductor devices and multilayer circuit boards. A photosensitive polyimide precursor composition, which can form patterns by means of i-line light and is applicable to practical uses, has not yet been obtained.

SUMMARY OF THE INVENTION

The present invention provides a photosensitive polyimide composition. From the composition, a polyimide film having more than a certain thickness can be obtained by taking the process of pattern formation by i-line exposure and a heat-cure. The composition is applicable to practical uses.

A desirable pattern is formed by exposing the photosensitive polyimide precursor composition to i-line light, which composition comprises polyimide precursors having a chemical structure selected from several specific chemical structures and/or specific amide bond density and is adjusted so that the film obtained by applying and drying the composition may exhibit specific absorbance. The polyimide film obtained by heat-curing the above pattern exhibits excellent physical properties and water resistance, and has high adhesive strength to epoxy resins, inorganic materials and metals.

DETAILED DESCRIPTION OF THE INVENTION

The present invention provides photosensitive compositions comprising:

(A) an aromatic polyimide precursor (hereinafter referred to as a polyimide precursor) having amide bond density of 1.5 mol/kg or more and a repeating unit represented by the general formula (I):

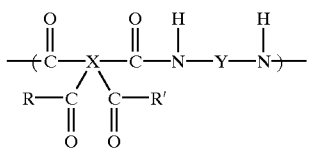
(I)

wherein X represents a tetravalent aromatic radical not including a fluorine atom or a tetravalent organic radical having a chemical structure in which 2 to 4 aromatic radicals are linked through at least one type of bond selected from the group consisting of a single bond, an ether bond, a thioether bond, a carbonyl bond, a methylene bond, a sulfoxide bond and a sulfone bond, and which does not include a fluorine atom; —COR and —COR' groups take the ortho positions against —CONH group; R and R' independently represent —OR$_1$, —NHR$_2$, —O$^-$N$^+$R$_3$R$_4$R$_5$R$_6$ or —OH groups, wherein R$_1$ to R$_3$ represent organic radicals having olefinically unsaturated bonds at least in part of the repeating units and may coexisit in the repeating units; and R$_4$ to R$_6$ independently represent a hydrogen atom or a hydrocarbon radical having 1 to 6 carbon atoms, and R or R', contained at least in part of repeating units, represents a residual group except for —OH; and Y represents a divalent aromatic radical not including a fluorine atom or a divalent organic radical having a chemical structure in which 2 to 6 aromatic radicals are linked through at least one type of bond-selected from the group consisting of a single bond, an ether bond, a thioether bond, a carbonyl bond, a methylene bond, a 2,2-propylene bond, a sulfoxide bond and a sulfone bond, and which does not include a fluorine atom, (B) a photopolymerization initiator, and (C) a solvent.

Moreover, the polyimide precursor of the photosensitive composition satisfies at least one of the following conditions:

(i) amide bond density is 2.42 mol/kg or less, (ii) X is a tetravalent radical wherein the aromatic radicals connected with —CONH groups has a chemical structure in which the aromatic radical is substituted with aprotic electron donating group, and (iii) Y is a divalent radical:

(iii-1) represented by the general formula (II):

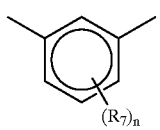
(II)

wherein R$_7$ represents an aliphatic hydrocarbon radical having 1 to 4 carbon atoms and n represents an integer of 0 to 3, (iii-2) represented by the general formula (III):

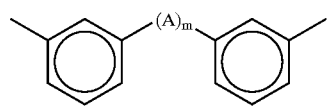
(III)

wherein A represents —CH$_2$—, —CO—, —SO$_2$—, —O—, —S—, a m-dioxyphenylene radical, a p-dioxyphenylene radical or a group represented by the general formula (III-1):

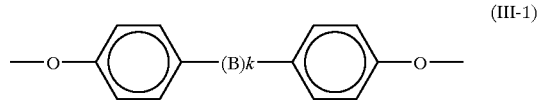
(III-1)

wherein B represents —CH$_2$—, —CO—, —SO$_2$—, —O—, —S—, a m-dioxyphenylene radical or a p-dioxyphenylene radical; and k represents 0 or 1; and m represents 0 or 1, (iii-3) represented by the general formula (IV):

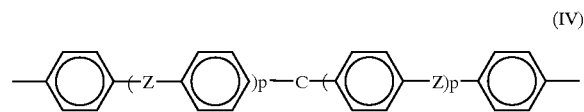
(IV)

wherein C represents —SO$_2$—, —SO— or —CO—, p represents 0, 1 or 2 and Z represents —O—, —CH$_2$— or

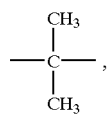

or (iii-4) wherein an aromatic radical connected with —NH— or an aromatic radical adjacent to such an aromatic radical through an ether bond has a chemical structure in which the aromatic radical is substituted with aprotic electron attracting group.

A film, which is obtained by applying and drying the photosensitive composition, has absorbance of 1.5 or less per 10 μm thick at 365 nm wavelength light.

In the composition of the present invention, the polyimide precursor used as component (A) is represented by the general formula (I).

As for each aromatic radical contained in X and Y in the general formula (I), groups having a benzene ring, a naphthalene ring or an anthracene ring are preferred because the heat resistance of a polyimide film obtained by heat-curing the photosensitive composition having such radicals is high. As for the type of bond between the aromatic radicals, one or more selected from the group consisting of a single bond, an ether bond, a carbonyl bond and a sulfone bond are preferred because of the the same reason as mentioned above.

When the —COR or —COR' group in the general formula (I) is an ester group represented by the general formula (V-1):

—COOR$_1$ (V-1)

wherein $R_1$ is as defined above, it is necessary that the ester group includes a group having an olefinically unsaturated bond such as a 2-acryloyloxyethyl-oxycarbonyl radical, a 2-methacloyloxyethloxycarbonyl radical, a 2-(1-acryloyloxy)propyloxycarbonyl radical, 2-(1-methacloyloxy)-propyloxycarbonyl radical, a 2-methacryl-aminoethyloxycarbonyl radical, a 3-methacloyloxy-2-hydroxy-propyloxycarbonyl radical and an acrylaminomethyloxycarbonyl radical. Additionally, the ester group may include a group not having an olefinically unsaturated bond such as an ethoxycarbonyl radical, a methoxycarbonyl radical, a 2-methoxy-ethoxycarbonyl radical or a 2-ethoxyethoxy-carbonyl radical.

When the —COR or —COR' group in the general formula (I) is an amide group represented by the general formula (V-2):

—CONHR$_2$ (V-2)

wherein $R_2$ is as defined above, it is necessary that the amide group includes a group having an olefinically unsaturated bond such as a N-(2-acryloyloxyethyl)aminocarbonyl radical and N-(2-methacryloxyethyl)aminocarbonyl radical. Additionally, the amide group may include a group not having an olefinically unsaturated bond such as a methylaminocarbonyl radical, a ethylaminocarbonyl radical or a N-(2-ethoxyethyl)aminocarbonyl radical.

When the —COR or —COR' group in the general formula (I) is an ammonium salt of carboxylic acid represented by the general formula (V-3):

—COO—.N$^+$R$_3$R$_4$R$_5$R$_6$ (V-3)

wherein $R_3$, $R_4$, $R_5$ and $R_6$ are as defined above, it is necessary that the ammonium salt of carboxylic acid includes a group having an olefinically unsaturated bond such as a carboxylic acid 2-methacloyloxyethyl-trimethylammonium salt or a carboxylic acid 2-acryloyloxyethyl-dimethylammonium salt. Additionally, the ammonium salt of carboxylic acid may include a group not having an olefinically unsaturated bond wherein all the $R_3$ to $R_6$ are hydrogen atoms or hydrocarbon radicals.

When the —COR or —COR' group in the general formula (I) is a carboxylic acid group, it is necessary that the groups mentioned in the general fomulas (V-1), (V-2) or (V-3) also exist in the repeating units of the polyimide precursor.

A polyimide precursor, which has a group selected from the groups represented by the general formulas (V-1), (V-2) and a carboxylic acid, and in which at least part of the repeating units has a residual group except a carboxylic acid, is preferably used because a coating thickness of the obtained photosensitive composition is almost unchanged during development and the polyimide pattern has good reproducibility from the photomask and has high resolution. A polyimide precursor, which has only the ester group represented by the general formula (V-1), is more preferably used because the obtained photosensitive composition has good storage stability and wide process margin for patterning, that is, the pattern is almost unchanged depending on a fluctuation of process conditions such as a process period in patterning, temperature.

In the composition of the present invention, the polyimide precursor used as component (A) should have amide bond density of 1.5 mol/kg or more. The amide bond density means a value obtained by dividing 2000 by a molecular weight of the repeating unit of the polyimide precursor or a value obtained by dividing 2000 by an average molecular weight, which is calculated from a molecular weight of each repeating unit and a molar ratio of each repeating unit if the polyimide precursor has several kinds of the repeating unit. The amide bond density is a parameter representing a mole value of an amide group present in 1 kg of the polyimide precursor. When the amide bond density is lower than 1.5 mol/kg, heat resistance is considerably degraded.

The polyimide precursor used represented by the general formula (I) is well-known as a precursor of a heat resistant macromolecule and is produced by known methods described by, for example, R. Rubner et al. ("Photographic Science Engineering", vol.23, p.303 (1979)), M. T. Pottiger et al. ("The 38th Electronic Components Conference", p.315 (1988)), L. Minnema et al. ("Polymer Engineering and Science". vol.28, no.12, p.815 (1988)) and Davis et al. ("Chemical & Engineering News; Sep. 26, 1983", p.23). Additionally, the polyimide precursor can be also produced by the methods described in U.S. Pat. Nos. 4,645,823 and 4,243,743, European Patent Unexamined Publication No. 421,195 and Japanese Patent Application Laid-Open No. 4226/1991.

According to these methods, the polyimide precursor is produced by using an aromatic tetracarboxylic dianhydride (hereinafter referred to as ATC dianhydride) represented by the general formula (VI), an aromatic diamino compound represented by the general formula (VII) as a part of raw materials.

(VI)

wherein X is as defined above.

H$_2$N—Y—NH$_2$ (VII)

wherein Y is as defined above.

When a compound having a group containing a fluorine atom such as a fluorine group and a trifluoromethyl group is used as a raw material for the polyimide precursor of the present invention, a fluorine-containing polyimide obtained by heat-curing the photosensitive composition is not applicable to practical uses because of its low adhesive strength to other material.

It is necessary to use a polyimide precursor satisfying at least one or more specific conditions in order to obtain the photosensitive composition of the present invention. Specific conditions mean the conditions (i) to (iii-4) mentioned above. As long as the photosensitive composition of the present invention satisfies the other conditions described in the above, conditions (i) to (iii-4) can be used without any restriction.

The amide bond density must be at least 1.5 mol/kg as mentioned above. When the amide bond density is 2.42 mol/kg or less and the condition of polyimide precursor described in (A) is satisfied, the composition of the present invention can be obtained regardless of the structure of the polyimide precursor and i-line absorbance of the obtained polymer coating becomes lower and water resistance of the heat-cured film becomes higher with a decrease in the amide bond density. The polyimide precursor having amide bond density of from 2.0 to 2.42 mol/kg is preferred because the obtained polyimide film has higher mechanical strength and heat resistance.

For the preparation of the polyimide precursor satisfying condition (ii), an ATC dianhydride is used, wherein the aromatic radical having a carboxylic anhydride group has a chemical structure in which the aromatic radical is substituted with an aprotic electron donating group (hereinafter referred to as ATC dianhydride under condition (ii)'). Herein, the aprotic group may not be a group having active hydrogen such as an alcohol, an amine and a carboxylic acid. The electron donating group indicates a substituting group, whose value of σp or σm is minus in Hammett's rule. The rule and value are widely known, for example, Section 365 of "Kagaku Binran Kisohen II" edited by Nippon Kagaku Kai and published by Maruzen Company, Limited in 1984. Representative examples of the aprotic electron donating groups include a dialkylamino group, an alkoxy group, an aryloxy group, a trialkylsilyl group, a benzyl group and an alkyl group. Representative examples of the ATC dianhydrides under condition (ii)' include 3,3',4,4'-diphenylether tetracarboxylic dianhydride, 1,4-dimetoxy-2,3,5,6-benzene tetracarboxylic dianhydride, 1,4-ditrimethylsilyl-2,3,5,6-benzene tetracarboxylic dianhydride, 1,4-bis-(3,4-dicarboxylphenoxy)benzene dianhydride, 1,3-bis(3,4-dicarboxylphenoxy)benzene dianhydride, 3,3',4,4'-diphenylmethane tetracarboxylic dianhydride, bis(3,4-dicarboxylphenoxy)dimethylsilane dianhydride, bis(3,4-dicarboxylphenoxy)methylamine dianhydride, 4,4'-bis(3,4-dicarboxylphenoxy)biphenyl dianhydride and 4,4'-bis(3,4-dicarboxylphonoxy)diphenylsulfone dianhydride.

In the present invention, as long as the absorbance of a coating obtained from the photosensitive composition is 1.5 or less per 10 μm thick at 365 nm wavelength, the ATC dianhydride represented by the general formula (VI) other than the one under condition (ii)' can be used: (1) by mixing with the ATC dianhydride under condition (ii)'; (2) by combining with the specific aromatic diamino compound mentioned below; or (3) if an aromatic polyimide precursor having specific amide bond density is obtained. Representative examples of these compounds include pyromellitic dianhydride, 2,3,5,6-naphthalene tetracarboxylic dianhydride, 3,3',4,4'-benzophenone tetracarboxylic dianhydride, 3,3',4,4'-biphenyltetracarboxylic dianhydride, 2,3,5,6-pyridine tetracarboxylic dianhydride, 2,3,6,7-quinoline tetracarboxylic dianhydride, 3,3',4,4'-diphenylsulfone tetracarboxylic dianhydride, 3,3',4,4'-diphenylsulfide tetracarboxylic dianhydride and 3,3',4,4'-diphenylsulfoxide tetracarboxylic dianhydride. In addition, they include 1,2,8,9-anthracene tetracarboxylic dianhydride, 1,4-bis(3,4-dicarboxylphenylsulfonyl)benzene dianhydride, 1,4-bis(3,4-dicarboxylphenylthio)benzene dianhydride, 3,3",4,4"-terphenyl tetracarboxylic dianhydride, 4-phenylbenzophenone-3,3",4,4"-tetracarboxylic dianhydride, 1,4-bis-(3,4-dicarboxylbenzoyl)-benzene dianhydride, 3,3''',4,4'''-quaterphenyl tetracarboxylic dianhydride, 4,4'-bis(3,4-dicarboxylphenoxy)-benzophenone dianhydride and 4,4'-bis(3,4-dicarboxylphenoxy)-diphenylsufoxide dianhydride.

For the preparation of the aromatic polyimide precursor satisfying condition (iii-1), an aromatic diamino compound wherein Y is a divalent group represented by the general formula (II) (hereinafter referred to as an aromatic diamino compound under condition (iii-1)') is used. Representative examples of the aromatic diamino compounds include methaphenylenediamine, 3,5-diaminotoluene, 2,4-diaminotoluene and 2,4-diaminomesitylene.

For the preparation of the aromatic polyimide precursor satisfying condition (iii-2), an aromatic diamino compound wherein Y is a divalent group represented by the general formula (III) (hereinafter referred to as an aromatic diamino compound under condition (iii-2)') is used. Representative examples of the aromatic diamino compounds include 4,4'-bis(3-aminophenoxy)bipenyl, 1,3-bis(3-aminophenoxy)benzene, 3,3'-diaminobiphenyl, 3,3'-diaminodiphenylether, 3,3'-diaminodiphenylsulfone, 3,3'-diamino-benzophenone, 3,3'-diaminodiphenylmethane, 3,3'-diamino-diphenylsulfide, 4,4'-bis(3-aminophenoxy)diphenylsulfone, 4,4'-bis(3-aminophenoxy)diphenylmethane, 4,4'-bis(3-aminophenoxy)diphenylether and 4,4'-bis(3-aminophenoxy)-diphenylsulfide.

For the preparation of the aromatic polyimide precursor satisfying condition (iii-3), an aromatic diamino compound wherein Y is a divalent group represented by the general formula (IV) (hereinafter referred to as an aromatic diamino compound under condition (iii-3)') is used. Representative examples of the aromatic diamino compounds include 4,4'-diaminodiphenylsulfone, 4,4'-diamino-benzohenone, 4,4'-diaminodiphenylsulfoxide, 4,4'-bis(4-aminophenoxy) diphenylsulfone, 4,4'-bis(4-aminophenoxy) diphenylsulfoxide and 4,4'-bis(4-aminophenoxy) benzophenone.

For the preparation of the aromatic polyimide precursor satisfying condition (iii-4), an aromatic diamino compound wherein an aromatic radical having an amino group or an aromatic radical adjacent to such an aromatic radical linked through an ether bond has a chemical structure in which the aromatic radical is substituted with an aprotic electron attracting group (hereinafter referred to as an aromatic diamino compound under condition (iii-4)') is used. The electron attracting group used herein indicates a substituting group having 0.2 or more of δp or δm value mentioned above. Aprotic electron attracting groups include an acyloxy group, an acylamino group, a halogen group, an alkylaminocarbonyl group, an alkoxycarbonyl group, an alkylcarbonyl group, a nitrile group, an alkylsulfone group, a nitro group and an alkoxysulfone group. Representative examples of the aromatic amino compounds under condition (iii-4)' include 4,4'-diamino-benzophenone, 4,4'-diaminodiphenylsulfone, 3,3'-diamino-diphenylsulfone, 4,4'-diaminodiphenylsulfoxide, bis[4-(4-aminophenoxy) phenyl]sulfone, 4,4'-bis[4-(4-aminophenoxy) phenylsulfonyl]diphenylether, bis[4-(3-aminophenoxy) phenyl]sulfone, 4,4'-bis(4-aminophenoxy)benzophenone, 1,4-bis(4aminophenylsulfonyl)benzene, 1,4-bis[4-(4-aminophenoxy)phenylsulfonyl]benzene, 4,4'-bis(4-aminophenylsulfonyl)diphenylether, 3,5-diaminoethylbenzoate, 2,4-diaminobenzamide, 3,5-diaminobenzophenone, 4-dimethyl-amino-3',5'-diamino-benzophenone, 3,5-diamino(2-methacryloxyethyl)benzoate, 3,5-diaminoacetanilide, 4-chloro-m-phenylenediamine, 3,5-diaminobenzonitrile and 5-nitro-m-phenylenediamine.

In the present invention, as long as the absorbance of a coating obtained from the photosensitive composition is 1.5 or less per 10 μm thick at 365 nm wavelength, the aromatic diamino compound represented by the general formula (VII) other than the specific aromatic diamino compound mentioned above can be used: (1) by mixing with the specific aromatic diamino compound mentioned above; (2) by combining with the ATC dianhydride under condition (ii)'; or (3) if an aromatic polyimide precursor having specific amide bond density is obtained. Representative examples of the aromatic diamino compounds, include 4,4'-diaminodiphenylether, 4,4'-diaminodiphenylsulfide, 3,4'- diaminodiphenylether, 1,4-phenylenediamine, 2,7-naphthalenediamine, 3,3'-dimethyl-4,4'-diaminobiphenyl, 3,3'-dimethoxy-4,4'-diaminobiphenyl, 3,3'-dichloro-4,4'-diaminobiphenyl, 1,4-bis(4-aminophenoxy)-benzene, 1,3-bis(4-aminophenoxy)benzene, 5,8-diaminoquinoline, 4,4'-bis(4-aminophenoxy)biphenyl, 4,4'-diaminodiphenylmethane, bis[4-(4-aminophenoxy)phenyl] ether, 1,4-bis(4-aminophenyl)-benzene, 9,10-bis(4-aminophenyl)anthracene, 4,4'-bis(4-aminophenoxy) diphenylmethane, 4,4'-bis(4-aminophenoxy)-diphenylsulfide, bis[2-(4-aminophenyl)-benzothiazolyl] ether, bis[2-(4-aminophenyl)-benzimidazolyl]sulfoxide, bis [2-(4-aminophenyl)-benzoxazolyl], 4-(4-aminophenylsulfonyl)-4'-aminobiphenyl, 4,4'-bis(4-aminophenyl)diphenylether and 1,4-di-(4-aminobenzoyloxy)butane. Of the aromatic diamino compounds under conditions (iii-1)' to (iii-4)', the aromatic diamino compounds under conditions (iii-2)' and (iii-3)' are preferred because polyimides obtained by heat-curing the photosensitive composition achieve high heat resistance, tensile strength and water resistance when they are used. Since the heat resistance, tensile strength and water resistance of the polyimides are further improved, of the aromatic diamino compounds under condition (iii-2)', bis[4-(3-aminophenoxy)phenyl]sulfone, 3,3'-diaminodiphenylsulfone, 1,3-bis(3-aminophenoxy)benzene and 4,4'-bis(3-aminophenoxy)biphenyl are more preferred; and, of the aromatic diamino compounds under condition (iii-3)', bis[4-(4-aminophenoxy)pnenyl]sulfone, 4,4'-diaminobenzophenone, 4,4'-bis[4-(4-aminophenoxy) phenoxy]-diphenylsulfone, 4,4'-diaminodiphenylsulfoxide and 4,4'-aiaminodiphenylsulfone are more preferred.

Representative examples of component (B) used as a photopolymerization initiator include benzophenone derivatives such as benzophenone, o-benzoyl methyl benzoate, 4-benzoyl-4'-methyl diphenyl ketone, dibenzyl ketone and fluorenone; acetophenone derivatives such as 2,2'-diethoxyacetophenone, 1-hydroxycyclohexylphenyl ketone and 2-hydroxy-2-methyl propiophenone; thioxanthaone derivatives such as thioxanthone, 2-methylthioxanthone, 2-isopropyl thioxanthone and diethyl thioxanthone; benzyl derivatives such as benzyl, benzyl dimethyl ketal and benzyl-β-methoxyethyl acetal; benzoin derivatives such as benzoin and benzoin methylether; azido derivatives such as 2,6-di(4-azidobenzylidene)-4-methylcyclohexanone and 2,6-di(4-azidobenzylidene)cyclohexanone; and oxime derivatives such as 1-phenyl-1,2-butadione-2-(O-methoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime and 1-phenyl-3-ethoxy-propanetrione-2-(O-benzoyl)oxime. Of these, oxime derivatives are preferred for its high photosensitivity. The amount of the photopolymerization initiator is preferably in the range of from 1 to 15 parts by weight per 100 parts by weight of polyimide precursor.

Representative examples of component (C) used as solvents include N,N'-dimethylformamide, N-methylpyrrolidone, N-acetyl-2-pyrrolidone, N,N'-dimethylacetamide, diethylene glycol dimethylether, cyclopentanone, γ-butyrolactone and α-acetyl-γ-butyrolactone. They may be used individually or in combination. These solvents may be employed in the range of from 100 to 400 parts by weight per 100 parts by weight of the polyimide precursor according to thickness of the films or viscosity of the composition.

The compounds having a reactive carbon-carbon double bond can be used in addition to the above-mentioned components (A) to (C) to improve photosensitivity of the present composition, if desired. Representative examples of such compounds include 1,6-hexandioldiacrylate, neopentyl glycol diacrylate, ethylene glycol diacrylate, polyethylene glycol diacrylate having 2 to 20 of repeating units, pentaerythritol diacrylate, dipentaerythritol hexacrylate, trimethylolpropane triacrylate, tetramethylolmethane tetraacrylate, methylene bisacrylamide, N-methylolacrylamide, and corresponding methacrylate and methacrylamide to the above-mentioned compounds. These compounds may be employed in the range of from 1 to 30 parts by weight per 100 parts by weight of the polyimide precursor.

Sensitizers can be used to improve photosensitivity of the present composition, if desired. Representative examples of the sensitizers include Michler's ketone, 4,4'-bis(diethylamino)benzophenone, 2,5-bis(4-diethylaminobenzylidene)cyclopentanone, 2,6-bis(4-diethylaminobenzylidene)cyclohexanone, 2,6-bis(4-dimethylaminobenzylidene)-4-methylcyclohexanone, 2,6-bis(4-diethylaminobenzylidene)-4-methylcyclohexanone, 4,4'-bis(dimethylamino)chalcone, 4,4'-bis(diethylamino)-chalcone, 2-(4'-dimethylamino cinnamylidene)indanone, 2-(4'-dimethylamino benzylidene)indanone, 2-(p-4'-dimethyl-aminobiphenyl)-benzothiazole, 1,3-bis(4-dimethylaminobenzylidene)acetone, 1,3-bis(4-diethylaminobenzylidene)-acitone, 3,3'-carbonyl-bis(7-diethylamino coumarin), 3-acetyl-7-dimethylamino coumarin, 3-ethoxycarbonyl-7-dimethylamino coumarin, 3-benzyloxycarbonyl-7-dimethylamino coumarin, 3-methoxycarbonyl-7-diethylamino coumarin, 3-ethoxycarbonyl-7-diethylamino coumarin, N-ethyl-N-phenyl-ethanolamine, N-phenyldiethanolamine, N-p-tolyldiethanolamine, N-phenyl-ethanolamine, 4-morpholino-benzophenone, 4-dimethylamino isoamylbenzoate, 4-diethylamino isoamylbenzoate, 2-mercaptobenzimidazole, 1-phenyl-5-mercapto-1,2,3,4-tetrazole, 2-mercapto-benzothiazole, 2-(p-dimethylaminostyryl)-benzoxazole, 2-(p-dimethylaminostyryl)-benzthiazole, 2-(p-dimethylaminostyryl)naphtho(1,2-d)-thiazole and 2-(p-dimethylaminobenzoyl)styrene. Of these, a combination of compounds having a mercaptho group and compounds having a dialkylaminophenyl group is preferred for its sensitivity. They may be used individually or in combination of two to five compounds. The amount of the sensitizer is preferably in the range of from 0.1 to 10 parts by weight per 100 parts by weight of the polyimide precursor.

An adhesion promoter can be added to the composition of the present invention to improve an adhesive strength, if desired. Representative examples of the promoter include γ-aminopropyltrimethoxysilane, N-(β-aminoethyl)-γ-aminopropylmethyldimethoxysilane, γ-glycidoxypropylmethyldimethoxysilane, γ-glycidoxypropylmethyldiethoxysilane, γ-mercapthopropylmethyldimethoxysilane, 3-methacryloxypropyldimethoxymethylsilane, 3-methacryloxypropyltrimethoxysilane, dimethoxymethyl-3-piperidinopropylsilane, diethyoxy-3-glycidoxypropylmethylsilane, N-(3-diethoxymethylsilylpropyl)succinimide, N-[3-(triethoxysilyl)propyl]phthalamic acid, benzophenone-3,3'-bis(3-triethoxysilylpropylaminocarbonyl)-4,4'-dicarboxylic acid and benzene-1,4-bis(3-triethoxysilylpropylaminocarbonyl)-2,5-dicarboxylic acid.

The amount of the promoter is preferably in the range of from 0.5 to 10 parts by weight per 100 parts by weight of the polyimide precursor.

A polymerization inhibitor can be added to the composition of the present invention to improve stability of sensitivity and viscosity of the composition solution in preservation, if desired. Representative examples of the inhibitor include hydroquinone, N-nitrosodiphenylamine, p-tert-butylcatechol, phenothiazine, N-phenylnaphthylamine, ethylenediamine tetraacetic acid, 1,2-cyclohexanediamine tetraacetic acid, 2',2'-diethyletherdiamine tetraacetic acid, 2,6-di-tert-butyl-p-methylphenol, 5-nitroso-8-hydroxyquinoline, 1-nitroso-2-naphthol, 2-nitroso-1-naphtol, 2-nitroso-5-(N-ethyl-N-sulfopropylamino)phenol, N-nitroso-N-phenylhydroxylamine ammonium salt, N-nitroso-N-(1-naphthyl)-hydroxylamine ammonium salt and bis(4-hydroxy-3,5-tert-butylphenyl)methane. The amount of the inhibitor is preferably in the range of from 0.005 to 5 parts by-weight per 100 parts by weight of the polyimide precursor.

In the present invention, it is necessary that the absorbance at 365 nm wavelength (i-line) light of a 10 μm thick dried coating obtained from a polyimide precursor composition be 1.5 or less to form a pattern on the film with i-line wavelength light. When the absorbance is over 1.5, the light intensity is not sufficient at the bottom of the film so that a satisfactory pattern is not formed.

The above-mentioned absorbance can be adjusted by the amounts of essential components (A) to (C) and other additives.

The photosensitive compositions of the present invention can be produced by mixing the above-mentioned components (A) to (C) and others And, from the thus obtained composition, a polyimide film can be obtained by taking steps as descirbed below.

The compositions of the present invention are applied on a substrate by using, for instance, a spin-coater, a bar-coater, a blade-coater, a curtain-coater, screen printing press and a spray-coater.

The resultant coating can be dried by air-drying, heating in an oven or on a hot plate, and vacuum drying.

The dried coating should be exposed with a ultraviolet ray, etc. as a light source by using an exposure equipment such as a contact aligner, a mirror projection aligner and a stepper. Of these, a stepper and i-line as a light source are preferred for its high resolution and easy handling.

The irradiated film can be developed by conventional methods for developing photoresist such as a spin-spray method, a puddle method and a dipping method with a supersonic wave. Preferably, a developing solution is a combination of good and poor solvents to the above-mentioned polyimide precursor. Representative examples of good solvents include N-methylpyrrolidone, N-acethyl-2-pyrrolidone, N,N'-dimethylacetamide, cyclopentanone, cyclohexanone, γ-butyrolactone, α-acethyl-γ-butyrolactone. Representative examples of poor solvents include toluene, xylene, methyl alcohol, ethyl alcohol, isopropyl alcohol and water. The ratio of both solvents is adjusted according to the solubility of the polyimide precursor. They may be used in combination. If necessary, when the polyimide precursor contains carboxylic acids, the aqueous solution of organic bases such as cholinehydroxide and tetra-methylammonium hydroxide can be used as a developing solution, or used by being added to the above-mentioned organic solvents according to the solubility of the polyimide precursor.

The resultant patterned film are heat-cured to obtain a polyimide film as a result of evaporation of volatile components. This process can be carried out by using a hot plate, an oven, and an oven capable of storing temperature program. Air, nitrogen and inert gas such as argon may be used as an atmosphere in heat-curing the patterned film.

DESCRIPTION OF PREFERRED EMBODIMENT

The present invention is now described in more detail by referring to Examples, but the scope thereof is not restricted by them.

Each characteristic of the compositions in Examples and Comparative Examples was determined as follows:

(1) Amide Bond Density

Amide bond density [C] is calculated according to the equation below.

$$[C] = \frac{2000}{[M]_C + [M]_A + [M]_S}$$

In the equation, $[M]_C$ represents the molecular weight of a tetracarboxylic acid unit, and it is calculated by subtracting 32 (=the atomic weight of oxygen atom×2) from the molecular weight of an ATC dianhydride used as a starting material. When two or more of ATC dianhydrides are employed, their average molecular weight is used for the calculation. $[M]_A$ represents the molecular weight of an aromatic diamine unit, and it is calculated by subtracting 2 (=the atomic weight of hydrogen atom×2) from the molecular weight of an aromatic diamino compound used as a starting material. When two or more of the aromatic diamino compounds are employed, their average molecular weight is used for the calculation. $[M]_S$ represents the total amount of substituting groups R and R' which bind to aromatic rings through carbonyl group in the polyimide precursor, and it is calculated by doubling the average molecular weight of R and R' radicals. The atomic weights used in the above calculation are 12 for carbon, 14 for nitrogen, 16 for oxygen, 32 for solfur and 1 for hydrogen, respectively. A numerator 2000 is the coefficient to calculate the mole value of amide bonds per 1 kg of the polyimide precursor.

(2) Absorbance of Polyimide Precursor

N-methylpyrrolidone solution of polyimide precursor is applied on a 1 mm thick quartz plate using a spin-coater and dried in an oven at 80° C. for 40 min. to form a 10 μm thick polyimide precursor coating. Then, its absorbance (referred to hereinafter as precursor absorbance) at 365 nm is measured by ultraviolet spectroscope UV-240 type (manufactured by Shimazu Corporation) and is calculated according to the following equation:

Absorbance=$\log_{10} I_0/I$ (wherein $I_0$ represents incident light intensity; I represents transmitted light intensity through a film.)

(3) Absorbance of Photosensitive Composition Coating

A photosensitive composition is applied on a 1 mm thick quartz plate using a spin-coater and dried in an oven at 80° C. for 40 min. to form a 10 μm thick photosensitive composition coating. Then, its absorbance (referred to hereinafter as coating absorbance) is measured by the same method as (2).

(4) Viscosity Number of Polyimide Precursor

Viscosity number (ηsp/c) of polyimide precursor in N-methylpyrrolidone (1 g/dl) is measured by Auto Viscometer AVL-2C (manufactured by San Denshi Ind. Co., Ltd.) at 30° C.

(5) Viscosity of Photosensitive Composition

Viscosity of the photosensitive composition solution is measured by an E type viscometer (manufactured by Tokyo Keiki Co., Ltd.: VISCONIC-EMD type) at 23° C.

(6) Tensile Strength and Elongation of Polyimide Film

In each Example, the general procedure is repeated except that the obtained film on the wafer is exposed without a photomask and is not developed. The resultant polyimide film is peeled from the wafer, and its tensile strength and elongation are measured according to ASTM D-882-88.

(7) Pull Test

Adhesive strength between a polyimide film and a silicon wafer is measured as follows. After the photosensitive composition on the wafer is heat-cured, a pin having a diameter of 2 mm is attached to the polyimide film with epoxy resin adhesive (Araldite® standard manufactured by Showa Highpolymer Co., Ltd.). The obtained sample is subjected to a pull test using a pull tester (manufactured by Quad Company Group, SEBASTIAN 5 type).

The standard of judgement:

| Pulling stress (kg/mm$^2$) | Adhesive strength |
|---|---|
| 7 or less | Good |
| 6 to 5 | Usable |
| Less than 5 | Poor |

(8) Water Resistance Test

After the photosensitive composition on the wafer is heat-cured, it is kept in boiling water for 48 hrs. and dried in an oven at 50° C. for 2 hrs. Then, it is subjected to the above-mentioned pull test.

The standard of judgement:

| Pulling stress (kg/mm$^2$) | Water resistance |
|---|---|
| 7 or more | Good |
| 6 to 3 | Usable |
| Less than 3 | Poor |

(9) Raw Material

ATC dianhydrides used in Preparations are represented by the following symbols. The structural formulas shown below represent X in the general formula (VI).

X-1: 3,3',4,4'-benzophenone tetracarboxylic dianhydride

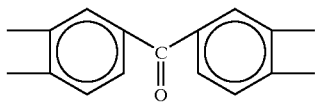

X-2: 3,3',4,4'-diphenylether tetracarboxylic dianhydride

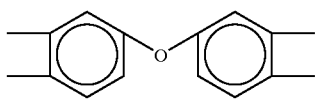

X-3: 3,3',4,4'-diphenylsulfone tetracarboxylic dianhydride

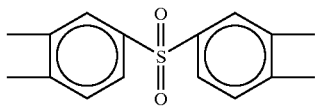

X-4: 3,3",4,4"-terphenyltetracarboxylic dianhydride

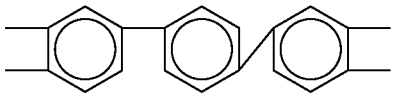

X-5: 1,4-bis(3,4-dicarboxylbenzoyl)benzene dianhydride

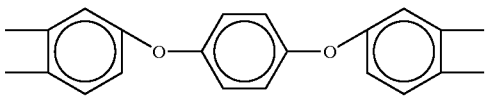

X-6: 4,4'-bis(3,4-dicarboxylphenoxy)bipheny dianhydride

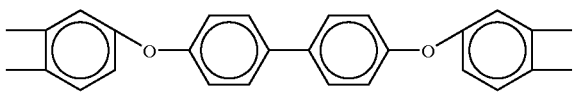

X-7: 4,4'-bis(3,4-dicarboxylphenoxy)diphenyl sulfone dianhydride

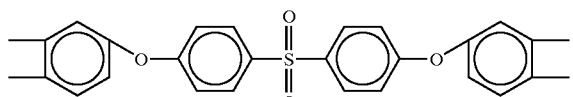

X-8: 3,3',4,4'-biphenyl tetracarboxylic dianydride

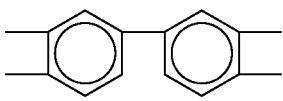

X-9: 1,4-dimetoxy-2,3,5,6-benzene tetracarboxylic dianhydride

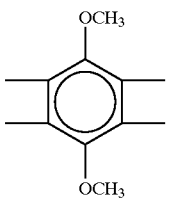

X-10: 3,3',4,4'-diphenylmethane tetracarboxylic dianhydride

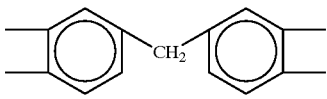

X-11: pyromellitic dianhydride

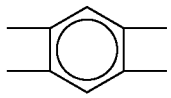

Aromatic diamino compounds used in the Preparations are represented by the following symbols. The structural formulas shown below represent Y in the general formula (VII).

Y-1: 4,4'-bis(4-aminophenoxy)biphenyl

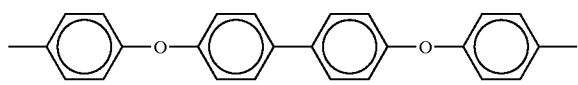

Y-2: 9,10-bis(4-aminophenyl)anthracene

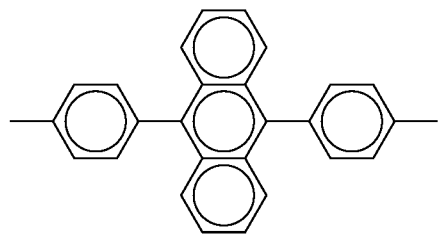

Y-3: bis [4-(4-aminophenoxy)phenyl]ether

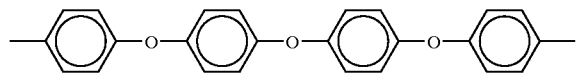

Y-4: bis[4-(3-aminophenoxy)phenyl]sulfone

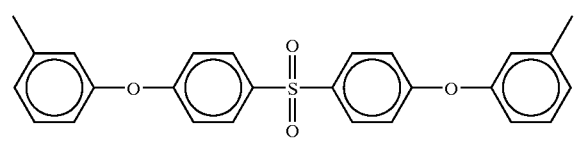

Y-5: 3,3'-diaminodiphenylsulfone

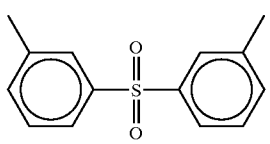

Y-6: 1,4-bis(4-aminophenoxy)benzene

Y-7: 1,3-bis(3-aminophenoxy)benzene

Y-8: bis[4-(4-aminophenoxy)phenyl]sulfone

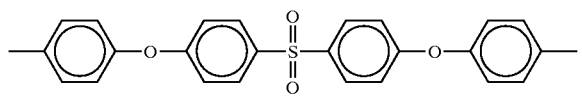

Y-9: 4,4'-bis(3-aminophenoxy)biphenyl

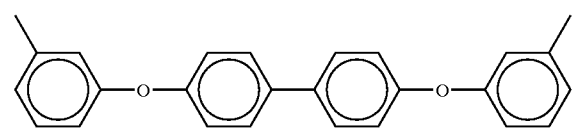

Y-10: 4,4'-diaminodiphenylether

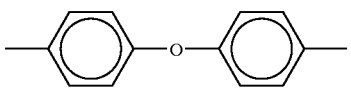

Y-11: p-phenylene diamine

Y-12: 4,4'-diaminodiphenylsufide

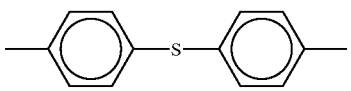

Y-13: 4,4'-diaminobenzophenone

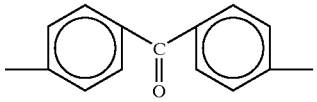

Y-14: 4,4'-bis[4-(4-aminophenoxy)phenoxy]diphenylsulfone

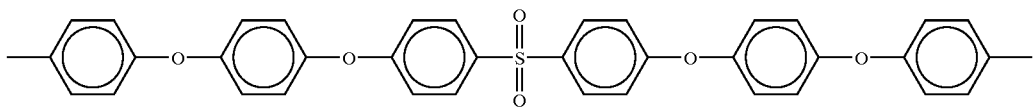

Y-15: 3,4'-diaminodiphenylether

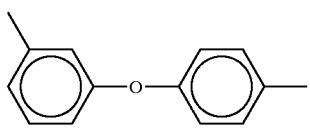

Y-16: 4,4'-diaminodiphenylsulfoxide

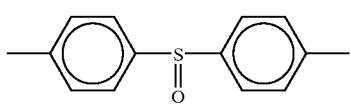

Y-17: 3,3'-dimethyl-4,4'-diaminobiphenyl

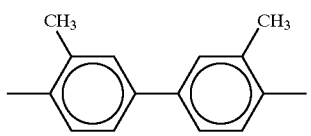

Y-18: 2,4-diaminomesitylene

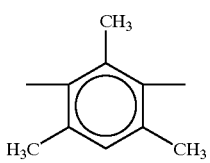

Y-19: m-phenylene diamine

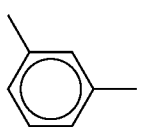

Y-20: 4,4'-diaminodiphenylsulfone

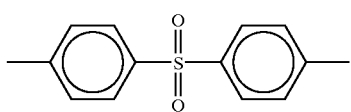

Y-21: 2,2-bis[4-(4-aminophenoxy)phenyl] hexafluoropropane

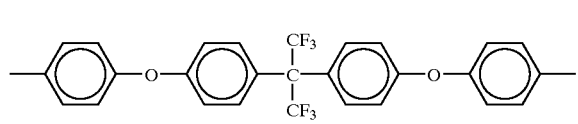

Y-22: 3,5-diamino ethylbenzoate

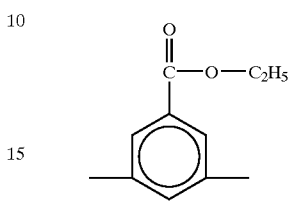

Y-23: 2,4-diaminobenzamide

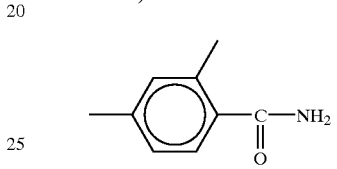

Y-24: 3,5-diaminobenzophenone

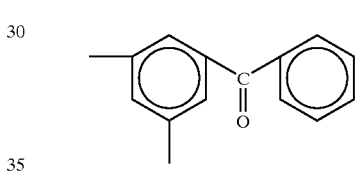

Y-25: 3,5-diamino(2-methacryloxyethyl)benzoate

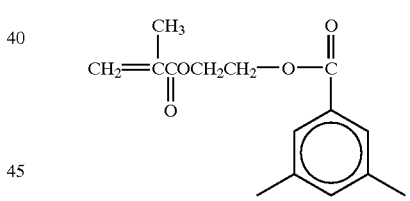

Y-26: 3,5-diaminobenzonitrile

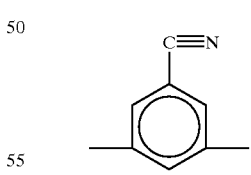

Y-27: 2,2-bis[4-(3-aminophenoxy)phenyl] hexafluoropropane

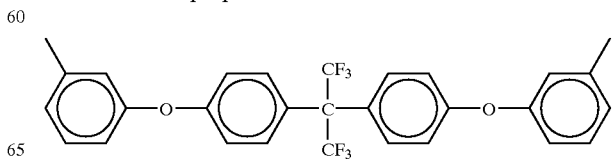

Y-28: 4,4'-diamino-3,3',5,5'-tetramethyldiphenylmethane

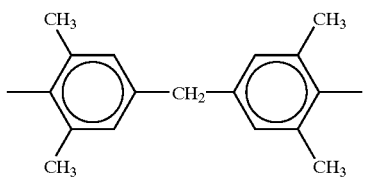

Compounds used in the Preparations to form —COR or —COR' groups (R-raw material) are represented by the following symbols.

E-1: 2-hydroxyethyl methacrylate

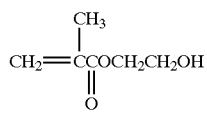

E-2: 2-isocyanateethyl methacrylate

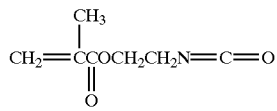

E-3: 2-diethylamino ethyl methacrylate

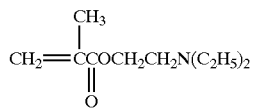

E-4: glycidyl methacrylate

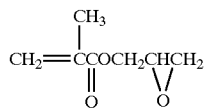

E-5: 2-hydroxyethyl acrylate

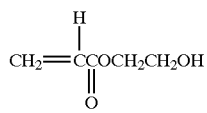

E-6: N-(2-hydroxyethyl)methacrylamide

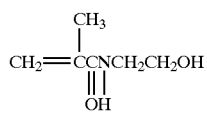

E-7: (2-hydroxypropyl)acrylamide

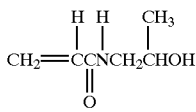

E-8: 2-metacryloxyethyltrimethylammoniumhydroxide

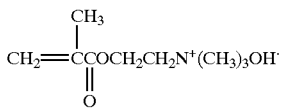

E-9: ethyl alchol $C_2H_5OH$

PREPARATION 1

16.1 g of X-1, 10.9 g of X-11, 27.0 g of E-1 and 60 ml of γ-butyrolactone were put in a 500 ml separable flask. 17.0 g of pyridine was put in the flask with stirring under ice cooling and the stirring was continued at room temperature for 16 hrs. The solution containing 40 ml of γ-butyrolactone and 41.2 g of dicyclohexylcarbodiimide was added under ice cooling in 30 min. Further, the suspension containing 70 ml of γ-butyrolactone and 35.0 g of Y-1 was added in 60 min. under ice cooling and then stirred under ice cooling for 3 hrs. 5 ml of ethyl alcohol was added and stirred for 1 hr. Then, the resultant was filtered to remove solid materials formed in the above process. The filtered reaction solution was added to 10 l of ethyl alcohol so that precipitates were formed. The resultant precipitates were separated from the solution by filtration and dried in vacuum.

Thus, polyimide precursor (A1-1) was prepared. Its viscosity number, amide bond density and precursor absorbance are shown in Table 5.

PREPARATION 2

62.0 g of X-2 and 462 ml of N,N'-dimethylacetamide (hereinafter referred to as DMAc) were put in a 500 ml separable flask. 100 ml of DMAc and 68.4 g of Y-2 were put in the flask with stirring under ice cooling and the stirring was continued at room temperature for 16 hrs. Further, 43.4 g of E-2 was added under ice cooling and stirred for 3 hrs. The resultant reaction solution was added to 10 l of ethyl alcohol so that precipitates were formed. The precipitates were separated from the solution by filtration and dried in vacuum.

Thus, polyimide precursor (A2-1) was prepared. Its viscosity number, amide bond density and precursor absorbance are shown in Table 5.

PREPARATION 3

76.8 g of Y-3 was dissolved in 450 g of N-methylpyrrolidone. 71.6 g of X-3 was added to the resultant solution and reacted at 50° C. for 6 hrs. A solution obtained by dissolving 74.0 g of E-3 in 110 g of N-methylpyrrolidone was slowly added to the above reacted solution at room temperature. As a result, a solution of polyimide precursor (A3-1) was obtained. Amide bond density and precursor absorbance of A3-1 are shown in Table 5.

PREPARATION 4

121.1 g of Y-4 was dissolved in 687 g of N-methylpyrrolidone. 88.2 g of X-8 was added to the resultant solution and stirred at room temperature for 12 hrs. Then, 85.3 g of E-4 was added to the stirred solution and further stirred at 70° C. for 36 hrs. As a result, a solution of polyimide precursor (A4-1) was obtained. Amide bond density and precursor absorbance of A4-1 are shown in Table 5.

PREPARATION 5

72.9 g of X-4 was dissolved in 200 g of N-methylpyrrolidone. 5.2 g of E-1 was added to the resultant solution and heated at 100° C. for 1 hr. After that, the solution was cooled to 50° C. 44.4 g of Y-5 and 110 g of N-methylpyrrolidone were added to the cooled solution and stirred at 50° C. for 5 hrs. Then, 76.0 g of trifluoro acetic anhydride and 280 ml of tetrahydrofuran were added to the solution and stirred at 50° C. for 2 hrs. While stirring, insoluble solid materials were separated out. 52.0 g of E-1 was added to the solution containing the insoluble solid materials and stirred at 50° C. for 5 hrs. The resultant insoluble solid materials were dissolved and a uniform solution was obtained. The uniform solution was poured in 10 l of water to form precipitates. The precipitates were separated from the solution by a filtration and dried in vacuum after being washed with water.

Thus, polyimide precursor (A5-1) was prepared. Its viscosity number, amide bond density and precursor absorbance are shown in Table 5.

PREPARATIONS 6 to 17

Polyimide precursors (A1-2 to A1-17) were prepared in the same manner as in Preparation 1 except that ATC dianhydrides, aromatic diamino compounds and R-raw materials shown in Table 1 were used respectively in the amounts shown in Table 1. Their viscosity numbers, amide bond density and precursor absorbance are shown in Table 5.

PREPARATIONS 18 to 25

Solutions of polyimide precursors (A3-2 to A3-9) were prepared in the same manner as in Preparation 3 except that ATC dianhydrides, aromatic diamino compounds and R-raw materials shown in Table 2 were used respectively in the amounts shown in Table 2. Their amide bond density and precursor absorbance are shown in Table 6.

PREPARATIONS 26 to 28

Polyimide precursors (A5-2 to A5-4) were prepared in the same manner as in Preparation 5 except that ATC dianhydrides shown in Table 2 were used in the amounts shown in Table 2. Their viscosity numbers, amide bond density and precursor absorbance are shown in Table 6.

PREPARATIONS 29 and 30

Polyimide precursors (A1-14 and A1-15) were prepared in the same manner as in Preparation 1 except that ATC dianhydrides, aromatic diamino compounds and R-raw materials shown in Table 2 were used respectively in the amounts shown in Table 2. Their viscosity numbers, amide bond density and precursor absorbance are shown in Table 6.

PREPARATION 31

31.0 g of X-2, 17.0 g of pyridine and 60 ml of γ-butyrolactone were put in a 500 ml separable flask. 27.0 g of E-1 was put in the flask with stirring. After being heated to 40° C. and maintained at that temperature for 4 hrs., the resultant solution was stirred at room temperature for 16 hrs. The solution containing 40 ml of γ-butyrolactone and 41.2 g of dicyclohexylcarbodiimide was added under ice cooling in 30 min. Further, the suspension containing 80 ml of γ-butyrolactone and 40.4 g of Y-8 was added in 60 min. and then stirred under ice cooling for 3 hrs. 5 ml of ethyl alcohol was added and stirred for 1 hr. Then, the resultant solution was filtered to remove solid materials formed in the above process. The filtered reaction solution was poured in 10 l of ethyl alcohol so that precipitates were formed. The precipitates were separated from the solution by filtration and dried in vacuum.

Thus, polyimide precursor (A1-16) was prepared. Its viscosity number, amide bond density and precursor absorbance are shown in Table 5.

PREPARATION 32

Polyimide precursor (A1-17) was prepared in the same manner as in Preparation 1 except that an ATC dianhydride and an aromatic diamino compound shown in Table 2 were used respectively in the amounts shown in Table 2 and the solution containing 160 ml of γ-butyrolactone and 23.6 g of Y-5 was used instead of the suspension containing 70 ml of γ-butyrolactone and 35.0 g of Y-1. Its viscosity number, amide bond density and precursor absorbance are shown in Table 6.

PREPARATION 33

Polyimide precursor (A2-2) was prepared in the same manner as in Preparation 2 except that an ATC dianhydride, an aromatic diamino compound and a R-raw material shown in Table 2 are used respectively in the amounts shown in Table 2. Its viscosity number, amide bond density and precursor absorbance are shown in Table 6.

PREPARATION 34

160.6 g of Y-7 was dissolved in 770 g of N-methylpyrrolidone. 120 g of X-11 was added to the resultant solution and reacted at 50° C. for 6 hrs. A solution obtained by dissolving 2.5 g of E-3 in 50 g of N-methylpyrrolidone was added to 50 g of the above reacted solution. As a result, a solution of polyimide precursor (A3-10) was obtained. The amide bond density and precursor absorbance of A3-10 are shown in Table 6.

PREPARATIONS 35 to 43

Polyimide precursors (A1-18 to A1-26) were prepared in the same manner as in Preparation 32 except that ATC dianhydrides, aromatic diamino compounds and R-raw materials shown in Table 3 were used respectively in the amounts shown in Table 3. Their viscosity numbers, amide bond density and precursor absorbance are shown in Table 7.

PREPARATION 44

22.8 g of Y-20 was dissolved in 150 g of N-methylpyrrolidone. 35.8 g of X-3 was added to the resultant solution and reacted at 50' C. for 6 hrs. A solution obtained by dissolving 37.2 g of E-3 in 66 g of N-methylpyrrolidone was slowly added to the above reacted solution at room temperature. As a result, a solution of polyimide precursor (A3-11) was obtained. Amide bond density and precursor absorbance of A3-11 are shown in Table 5.

PREPARATIONS 45 to 48

Polyimide precursors (A1-28 to A1-31) were prepared in the same manner as in Preparation 32 except that ATC dianhydrides, aromatic diamino compounds and R-raw materials shown in Table 3 were used respectively in the amounts shown in Table 3. Their viscosity numbers, amide bond density and precursor absorbance are shown in Table 7.

PREPARATIONS 49 and 50

Solutions of polyimide precursors (A4-2 and A4-3) were prepared in the same manner as in Preparation 4 except that ATC dianhydrides and aromatic diamino compounds shown in Table 3 were used respectively in the amounts shown in Table 3. Viscosity numbers, amide bond density and precursor absorbance of A4-2 and A4-3 are shown in Table 7.

PREPARATIONS 51 and 52

Solutions of polyimide precursors (A3-12 and A3-13) were prepared in the same manner as in Preparation 44 except that R-raw materials shown in Table 4 were used respectively in the amounts shown in Table 4. Viscosity numbers, amide bond density and precursor absorbance of A3-12 and A3-13 are shown in Table 8.

PREPARATIONS 53 to 58

Polyimide precursors (A1-32 to A1-37) were prepared in the same manner as in Preparation 43 except that ATC dianhydrides and aromatic diamino compounds shown in Table 4 were used respectively in the amounts shown in Table 4. Their viscosity numbers, amide bond density and precursor absorbance are shown in Table 8.

PREPARATIONS 59 and 60

Polyimide precursors (A5-5 and A5-6) were prepared in the same manner as in Preparation 5 except that ATC dianhydrides shown in Table 4 were used respectively in the amounts shown in Table 4. Their viscosity numbers, amide bond density and precursor absorbance are shown in Table 8.

PREPARATION 61

Polyimide precursor (A1-38) was prepared in the same manner as in Preparation 32 except that an ATC dianhydride, an aromatic diamino compound and a R-raw material shown in Table 4 were used respectively in the amounts shown in Table 4. Its viscosity number, amide bond density and precursor absorbance are shown in Table 8.

TABLE 1

| | ATC dianhydride | | Aromatice diamino compound | | R-raw material | | Polyimide precursor |
|---|---|---|---|---|---|---|---|
| | Type | Amount (g) | Type | Amount (g) | Type | Amount (g) | |
| 1 | X-1 | 16.1 | Y-1 | 35.0 | E-1 | 27.0 | A1-1 |
| | X-11 | 10.9 | | | | | |
| 2 | X-2 | 62.0 | Y-2 | 68.4 | E-2 | 43.4 | A2-1 |
| 3 | X-3 | 71.6 | Y-3 | 76.8 | E-3 | 74.0 | A3-1 |
| 4 | X-8 | 88.2 | Y-4 | 121.1 | E-4 | 85.3 | A4-1 |
| 5 | X-4 | 72.9 | Y-5 | 44.4 | E-1 | 57.2 | A5-1 |
| 6 | X-1 | 32.1 | Y-6 | 27.8 | E-1 | 27.0 | A1-2 |
| 7 | | | Y-7 | 27.8 | | | A1-3 |
| 8 | | | Y-8 | 40.4 | | | A1-4 |

TABLE 1-continued

| | ATC dianhydride | | Aromatice diamino compound | | R-raw material | | Polyimide precursor |
|---|---|---|---|---|---|---|---|
| | Type | Amount (g) | Type | Amount (g) | Type | Amount (g) | |
| 9 | | | Y-4 | 40.4 | | | A1-5 |
| 10 | | | Y-9 | 34.3 | | | A1-6 |
| 11 | | | Y-10 | 18.7 | | | A1-7 |
| 12 | | | Y-11 | 10.3 | | | A1-8 |
| 13 | | | Y-14 | 58.5 | | | A1-9 |
| 14 | | | Y-8 | 40.4 | E-5 | 23.9 | A1-10 |
| 15 | | | | | E-1 | 13.5 | A1-11 |
| | | | | | E-9 | 4.6 | |
| 16 | | | | | E-6 | 26.8 | A1-12 |
| 17 | | | | | E-7 | 27.0 | A1-13 |

TABLE 2

| | ATC dianhydride | | Aromatice diamino compound | | R-raw material | | Polyimide precursor |
|---|---|---|---|---|---|---|---|
| | Type | Amount (g) | Type | Amount (g) | Type | Amount (g) | |
| 18 | X-3 | 71.6 | Y-5 | 49.6 | E-3 | 74.0 | A3-2 |
| 19 | | | Y-12 | 43.2 | | | A3-3 |
| 20 | | | Y-13 | 42.4 | | | A3-4 |
| 21 | X-3 | 71.6 | Y-15 | 40.0 | E-3 | 74.0 | A3-5 |
| 22 | | | Y-16 | 46.4 | | | A3-6 |
| 23 | | | Y-17 | 42.4 | | | A3-7 |
| 24 | | | Y-5 | 49.6 | E-8 | 75.6 | A3-8 |
| 25 | | | | | E-3 | 44.4 | A3-9 |
| 26 | X-5 | 79.2 | Y-5 | 44.4 | E-1 | 57.2 | A5-2 |
| 27 | X-6 | 94.2 | | | | | A5-3 |
| 28 | X-7 | 106.8 | | | | | A5-4 |
| 29 | X-7 | 54.2 | Y-14 | 58.5 | E-1 | 27.0 | A1-14 |
| 30 | X-3 | 35.8 | Y-8 | 40.4 | | | A1-15 |
| 31 | X-2 | 31.0 | Y-8 | 40.4 | | | A1-16 |
| 32 | X-1 | 16.1 | Y-5 | 23.6 | | | A1-17 |
| | X-11 | 10.9 | | | | | |
| 33 | X-1 | 64.4 | Y-18 | 28.0 | E-2 | 31.0 | A2-2 |
| 34 | X-11 | 120.0 | Y-7 | 160.6 | E-3 | 2.5 | A3-10 |

TABLE 3

| | ATC dianhydride | | Aromatice diamino compound | | R-raw material | | Polyimide precursor |
|---|---|---|---|---|---|---|---|
| | Type | Amount (g) | Type | Amount (g) | Type | Amount (g) | |
| 35 | X-1 | 32.2 | Y-4 | 20.2 | E-1 | 27.0 | A1-18 |
| | | | Y-8 | 20.2 | | | |
| 36 | X-11 | 21.8 | Y-4 | 28.3 | | | A1-19 |
| | | | Y-9 | 10.3 | | | |
| 37 | X-1 | 32.2 | Y-4 | 24.2 | | | A1-20 |
| | | | Y-21 | 19.4 | | | |
| 38 | | | Y-19 | 10.1 | | | A1-21 |
| 39 | X-11 | 21.8 | Y-4 | 40.4 | | | A1-22 |
| 40 | X-8 | 29.4 | | | | | A1-23 |
| 41 | X-1 | 32.2 | Y-19 | 6.1 | E-1 | 27.0 | A1-24 |
| | | | Y-10 | 7.5 | | | |
| 42 | | | Y-27 | 48.5 | | | A1-25 |
| 43 | | | Y-20 | 23.6 | | 26.0 | A1-26 |
| 44 | X-3 | 35.8 | Y-20 | 22.8 | E-3 | 37.2 | A3-11 |
| 45 | X-11 | 21.8 | Y-5 | 23.6 | E-1 | 26.0 | A1-28 |
| 46 | X-2 | 31.0 | Y-20 | 23.6 | | | A1-29 |
| 47 | X-1 | 32.2 | Y-13 | 21.2 | | | A1-30 |
| 48 | X-3 | 35.8 | Y-16 | 22.0 | | | A1-31 |
| 49 | X-1 | 32.2 | Y-5 | 23.6 | E-4 | 85.3 | A4-2 |
| 50 | X-2 | 31.0 | | | | | A4-3 |

TABLE 4

| | ATC dianhydride | | Aromatic diamino compound | | R-raw material | | Polyimide precursor |
|---|---|---|---|---|---|---|---|
| | Type | Amount (g) | Type | Amount (g) | Type | Amount (g) | |
| 51 | X-3 | 35.8 | Y-20 | 22.8 | E-8 | 37.8 | A3-12 |
| 52 | | | | | E-3 | 22.2 | A3-13 |
| 53 | X-1 | 32.2 | Y-22 | 16.8 | E-1 | 26.0 | A1-32 |
| 54 | X-8 | 29.4 | Y-23 | 14.0 | | | A1-33 |
| 55 | X-11 | 21.8 | Y-24 | 19.7 | | | A1-34 |
| 56 | X-8 | 29.4 | Y-25 | 24.6 | | | A1-35 |
| 57 | X-2 | 31.0 | Y-10 | 18.5 | | | A1-36 |

TABLE 4-continued

| | ATC dianhydride | | Aromatic diamino compound | | R-raw material | | Polyimide precursor |
|---|---|---|---|---|---|---|---|
| | Type | Amount (g) | Type | Amount (g) | Type | Amount (g) | |
| 58 | X-1 | 32.2 | Y-26 | 12.4 | | | A1-37 |
| 59 | X-9 | 54.8 | Y-5 | 44.4 | | 57.2 | A5-5 |
| 60 | X-10 | 60.7 | | | | | A5-6 |
| 61 | X-1 | 32.2 | Y-28 | 24.1 | E-1 | 27.0 | A1-38 |

TABLE 5

| | Polyimide precursor | Viscosity number (dl/g) | Amide bond density (mol/kg) | Precursor absorbance | Condition*¹ (i) | Condition*¹ (ii) | Condition*² (iii) | Ex.*³ |
|---|---|---|---|---|---|---|---|---|
| 1 | A1-1 | 0.38 | 2.32 | 1.4 | ○ | X | X | 1 |
| 2 | A2-1 | 0.48 | 2.42 | 1.4 | ○ | ○ | X | 2 |
| 3 | A3-1 | — | 1.80 | 0.6 | ○ | X | X | 3 |
| 4 | A4-1 | — | 1.98 | 1.2 | ○ | X | 2, 4 | 4 |
| 5 | A5-1 | 0.92 | 2.38 | 0.7 | ○ | X | 2, 4 | 5 |
| 6 | A1-2 | 0.53 | 2.39 | 1.2 | ○ | X | X | 6 |
| 7 | A1-3 | 0.25 | 2.39 | 1.0 | ○ | X | 2 | 7 |
| 8 | A1-4 | 0.65 | 2.04 | 1.1 | ○ | X | 3, 4 | 8 |
| 9 | A1-5 | 0.25 | 2.04 | 0.57 | ○ | X | 2, 4 | 9 |
| 10 | A1-6 | 0.32 | 2.19 | 0.64 | ○ | X | 2 | 10 |
| 11 | A1-7 | 0.42 | 2.68 | 2.7 | X | X | X | Comp. Ex. 1 |
| 12 | A1-8 | 0.39 | 3.06 | 6.0 | X | X | X | Comp. Ex. 2 |
| 13 | A1-9 | 0.53 | 1.72 | 0.3 | ○ | X | 3 | 11 |
| 14 | A1-10 | 0.34 | 2.11 | 0.9 | ○ | X | 3, 4 | 12 |
| 15 | A1-11 | 0.40 | 2.24 | 0.9 | ○ | X | 3, 4 | 13 |
| 16 | A1-12 | 0.31 | 2.05 | 0.8 | ○ | X | 3, 4 | 14 |
| 17 | A1-13 | 0.38 | 2.04 | 0.8 | ○ | X | 3, 4 | 15 |

*¹: Conditions (i) and (ii) conrrespond to conditions (i) and (ii) in the claims.
○: Satisfying conditions (i) and (ii)
X: Not satisfying conditions (i) and (ii)
*²: Condition (iii) corresponds to conditions (iii-1) to (iii-4) in the claims.
Numbers: Indicating the numbers of condition (iii) when condition (iii) is satisfied.
X: Not satisfying condition (iii)
*³: The number indicates the example where the polyimide precursor is used.

TABLE 6

| | Polyimide precursor | Viscosity number (dl/g) | Amide bond density (mol/kg) | Precursor absorbance | Condition*¹ (i) | Condition*¹ (ii) | Condition*² (iii) | Ex.*³ |
|---|---|---|---|---|---|---|---|---|
| 18 | A3-2 | — | 2.05 | 0.7 | ○ | X | 2, 4 | 19 |
| 19 | A3-3 | — | 2.12 | 1.2 | ○ | X | X | 20 |
| 20 | A3-4 | — | 2.13 | 1.0 | ○ | X | 3, 4 | 21 |
| 21 | A3-5 | — | 2.16 | 1.0 | ○ | X | X | 22 |
| 22 | A3-6 | — | 2.08 | 1.4 | ○ | X | 3, 4 | 23 |
| 23 | A3-7 | — | 2.13 | 1.4 | ○ | X | X | 24 |
| 24 | A3-8 | — | 2.11 | 0.6 | ○ | X | 2, 4 | 25 |
| 25 | A3-9 | — | 2.42 | 0.6 | ○ | X | 2, 4 | 26 |
| 26 | A5-2 | 0.33 | 2.29 | 0.4 | ○ | ○ | 2, 4 | 16 |
| 27 | A5-3 | 0.31 | 2.11 | 0.3 | ○ | ○ | 2, 4 | 17 |
| 28 | A5-4 | 0.30 | 1.97 | 0.5 | ○ | ○ | 2, 4 | 18 |
| 29 | A1-14 | 0.32 | 1.45 | 0.3 | X | ○ | 3 | Comp. Ex. 3 |
| 30 | A1-15 | 0.35 | 1.97 | 0.6 | ○ | X | 3, 4 | 27 |
| 31 | A1-16 | 0.34 | 2.07 | 0.3 | ○ | ○ | 3, 4 | 28 |
| 32 | A1-17 | 0.32 | 2.70 | 1.3 | X | X | 2, 4 | 29 |
| 33 | A2-2 | 0.42 | 3.19 | 1.3 | X | X | 1 | 30 |
| 34 | A3-10 | 0.28 | 3.30 | 1.1 | X | X | 2 | 31 |

*¹: Conditions (i) and (ii) conrrespond to conditions (i) and (ii) in the claims.
○: Satisfying conditions (i) and (ii)

TABLE 6-continued

| | Polyimide precursor | Viscosity number (dl/g) | Amide bond density (mol/kg) | Precursor absorbance | Condition*1 (i) | Condition*1 (ii) | Condition*2 (iii) | Ex.*3 |
|---|---|---|---|---|---|---|---|---|

X: Not satisfying conditions (i) and (ii)
*2: Condition (iii) corresponds to conditions (iii-1) to (iii-4) in the claims.
Numbers: Indicating the numbers of condition (iii) when condition (iii) is satisfied.
X: Not satisfying condition (iii)
*3: The number indicates the example where the polyimide precursor is used.

TABLE 7

| | Polyimide precursor | Viscosity number (dl/g) | Amide bond density (mol/kg) | Precursor absorbance | Condition*1 (i) | Condition*1 (ii) | Condition*2 (iii) | Ex.*3 |
|---|---|---|---|---|---|---|---|---|
| 35 | A1-18 | 0.26 | 2.04 | 0.95 | ○ | X | 2, 3, 4 | 32 |
| 36 | A1-19 | 0.28 | 2.09 | 1.1 | ○ | X | 2, 4 | 33 |
| 37 | A1-20 | 0.30 | 1.99 | 0.96 | ○ | X | 2, 4 | Comp. Ex. 4 |
| 38 | A1-21 | 0.26 | 3.06 | 1.4 | X | X | 1 | 34 |
| 39 | A1-22 | 0.28 | 2.29 | 0.72 | ○ | X | 2, 4 | 35 |
| 40 | A1-23 | 0.20 | 2.11 | 0.60 | ○ | X | 2, 4 | 36 |
| 41 | A1-24 | 0.34 | 2.90 | 2.0 | X | X | 1 | Comp. Ex. 5 |
| 42 | A1-25 | 0.28 | 1.88 | 0.48 | ○ | X | X | Comp. Ex. 6 |
| 43 | A1-26 | 0.30 | 2.52 | 1.3 | X | X | 3, 4 | 37 |
| 44 | A3-11 | 0.29 | 2.04 | 0.8 | ○ | X | 3, 4 | 43 |
| 45 | A1-28 | 0.33 | 2.90 | 1.2 | X | X | 2, 4 | 38 |
| 46 | A1-29 | 0.25 | 2.56 | 1.1 | X | ○ | 3, 4 | 39 |
| 47 | A1-30 | 0.31 | 2.64 | 1.3 | X | X | 3 | 40 |
| 48 | A1-31 | 0.30 | 2.57 | 1.2 | X | X | 3, 4 | 46 |
| 49 | A4-2 | 0.24 | 2.34 | 1.3 | ○ | X | 2, 4 | 41 |
| 50 | A4-3 | 0.25 | 2.38 | 1.1 | ○ | ○ | 2, 4 | 42 |

*1: Conditions (i) and (ii) conrrespond to conditions (i) and (ii) in the claims.
○: Satisfying conditions (i) and (ii)
X: Not satisfying conditions (i) and (ii)
*2: Condition (iii) corresponds to conditions (iii-1) to (iii-4) in the claims.
Numbers: Indicating the numbers of condition (iii) when condition (iii) is satisfied.
X: Not satisfying condition (iii)
*3: The number indicates the example where the polyimide precursor is used.

TABLE 8

| | Polyimide precursor | Viscosity number (dl/g) | Amide bond density (mol/kg) | Precursor absorbance | Condition*1 (i) | Condition*1 (ii) | Condition*2 (iii) | Ex.*3 |
|---|---|---|---|---|---|---|---|---|
| 51 | A3-12 | 0.31 | 2.03 | 0.8 | ○ | X | 3, 4 | 44 |
| 52 | A3-13 | 0.36 | 2.42 | 0.9 | ○ | X | 3, 4 | 45 |
| 53 | A1-32 | 0.46 | 2.75 | 0.5 | X | X | 4 | 47 |
| 54 | A1-33 | 0.22 | 2.87 | 1.2 | X | X | 4 | 48 |
| 55 | A1-34 | 0.39 | 3.06 | 0.8 | X | X | 4 | 49 |
| 56 | A1-35 | 0.26 | 2.56 | 0.4 | X | X | 4 | 50 |
| 57 | A1-36 | 0.49 | 2.72 | 0.6 | X | ○ | X | 51 |
| 58 | A1-37 | 0.48 | 2.95 | 0.9 | X | X | 4 | 52 |
| 59 | A5-5 | 0.39 | 2.67 | 0.3 | X | ○ | 2, 4 | 53 |
| 60 | A5-6 | 0.38 | 2.56 | 0.8 | X | ○ | 2, 4 | 54 |
| 61 | A1-38 | 0.35 | 2.5 | 1.8 | X | X | X | Comp. Ex. 7 |

*1: Conditions (i) and (ii) conrrespond to conditions (i) and (ii) in the claims.
○: Satisfying conditions (i) and (ii)
X: Not satisfying conditions (i) and (ii)
*2: Condition (iii) corresponds to conditions (iii-1) to (iii-4) in the claims.
Numbers: Indicating the numbers of condition (iii) when condition (iii) is satisfied.
X: Not satisfying condition (iii)
*3: The number indicates the example where the polyimide precursor is used.

Before describing the Examples, symbols used for each compound in the Examples are shown.

Photopolymerization Initiator (Component (B))

I-1: benzophenone
I-2: benzyl
I-3: 2-isopropylthioxanthone
I-4: 1,3-diphenyl-propanetrione-2-(O-ethoxycarbonyl) oxime I-5: 1-phenyl-3-ethoxy-propanetrione-2-(O-benzoyl) oxime Reactive Carbon-carbon Double Bond-containing Compound M-1: tetraethylene glycol dimethacrylate
M-2: pentaerythritol diacrylate
M-3: methylenebisacrylamide
M-4: N-methylolacrylamide
M-5: trimethylolpropane triacrylate Sensitizer S-1: Michler's ketone
S-2: 4,4'-bis(diethylamino)benzophenone
S-3: 2-(p-dimethylaminostyryl)benzoxazole
S-4: 2-(p-dimethylaminobenzoyl)styrene
S-5: N-phenyldiethanolamine
S-6: N-p-toluyldiethanolamine
S-7: N-phenylethanolamine
S-8: 2-mercaptobenzimidazole
S-9: 1-phenyl-5-mercapto-1,2,3,4-tetrazole
S-10: 2-mercaptobenzothiazole Adhesion Promoter F-1: γ-glycidoxypropylmethyldimethoxysilane
F-2: 3-methacryloxypropyltrimethoxysilane
F-3: 3-methacryloxypropylmethyldimethoxysilane
F-4: N-[3-(triethoxysilyl)propyl]phthalamic acid
F-5: benzophenone-3,3'-bis(3-triethoxysilylpropylaminocarbonyl)-4,4'-dicarboxylic acid Polymerization Inhibitor Z-1: N-nitrosodiphenylamine
Z-2: bis(4-hydroxy-3,5-tert-butylphenyl)methane
Z-3: 2,6-di-tert-butyl-p-methylphenol
Z-4: 2-nitroso-1-naphthol

EXAMPLE 1

50 g of polyimide precursor (A1-1), 2 g of I-1, 6 g of M-1, 0.05 g of S-1, 1 g of S-5, 1.5 g of S-8, 1 g of F-1 and 0.05 g of Z-1 were dissolved in 75 g of N-methylpyrrolidone to obtain photosensitive composition (W-1). Its coating absorbance and viscosity were 1.5 and 73.5 P, respectively.

The obtained composition was applied on 3 inch silicon wafers by using a spin-coater, and dried to form 13 μm thick films. Using an i-line stepper FPA 2001 iI (manufactured by Canon Inc.), the films on the wafers were exposed through a patterned reticle at an exposure energy of 800 mJ/cm$^2$. Then, they were developed by spraying a mixed solvent of γ-butyrolactone and xylene (50/50 vol. %) and rinsed with isopropyl alcohol. As a result, a sharp 10 μm line/space pattern was obtained.

The irradiated films on the wafers were heat-cured at 140° C. for 1 hr. and at 300° C. for 1 hr. under nitrogen atmosphere in a convection oven to obtain 7 μm thick patterned polyimide films. The resultant films were broken at a pulling stress of 8 kg/cm2 in both of the pull and water resistance tests. They showed good adhesive strength and water resistance. The tensile strength and elongation of the polyimide films were 14 kg/mm$^2$ and 30%, respectively.

EXAMPLE 2

20 g of polyimide precursor (A-2), 0.3 g of I-2, 0.5 g of M-2, 0.02 g of S-2, 0.1 g of S-9, 0.15 g of F-3 and 0.01 g of Z-2 were dissolved in 40 g of N-methylpyrrolidone to obtain photosensitive composition (W-2). Its coating absorbance and viscosity were 1.5 and 44 P, respectively.

The obtained composition was applied on 3 inch silicon wafers by using a spin-coater, and dried to form 13 μm thick films. Using an i-line stepper NSR-1505 i7A (manufactured by Nikon Corporation), the films on the wafers were exposed through a patterned reticle at an exposure energy of 400 mJ/cm$^2$. Then, they were developed in a mixed solvent of tetramethyl ammonium hydroxide, methyl alcohol and water (0.3/2.7/97 vol. %), and rinsed with water. As a result a sharp 10 μm line/space pattern was obtained.

The irradiated films on the wafers were baked at 200° C. for 10 min. on a hot plate and heat-cured at 350° C. for 1 hr. under nitrogen atmosphere in a curing furnace to form 7 μm thick polyimide patterned films. The resultant films were broken at a pulling stress of 8 kg/mm$^2$ in both of the pull and water resistance tests. They showed good adhesive strength and water resistance. The tensile strength and elongation of the polyimide films were 20 kg/mm$^2$ and 9%, respectively.

EXAMPLE 3

0.2 g of I-3, 0.8 g of M-3, 0.02 g of S-3, 0.3 g of S-6, 0.15 g of S-10, 0.1 g of F-3 and 0.01 g of Z-3 were dissolved in 77 g of the solution of polyimide precursor (A3-1) prepared in Preparation 3 to obtain photosensitive composition (W-3). Its coating absorbance and viscosity were 0.8 and 55.0 P, respectively.

The obtained composition was applied on 3 inch silicon wafers by using a spin-coater, and dried to form 17 μm thick films. Using an exposure machine PLA 501F (manufactured by Canon Inc.) and i-line band pass filter UVD 36C (manufactured by Toshiba Glass Co., Ltd.), the films on the wafers were exposed through a photomask at an exposure energy of 1000 mJ/cm$^2$. Then, they were developed by spraying a mixed solvent of N,N'-dimethylacetoamide and ethyl alcohol (80/20 vol. %), and rinsed with isopropyl alcohol. As a result, a sharp 10 μm line/space pattern was obtained.

The irradiated films on the wafers were heat-cured at 140° C. for 1 hr. and at 300° C. for 1 hr. under nitrogen atmosphere in a convection oven to form 8 μm thick patterned polyimide films. The resultant films were broken at a pulling stress of 8 kg/mm$^2$ in both of the pull and water resistance tests. They showed good adhesive strength and water resistance. The tensile strength and elongation of the polyimide films were 12 kg/mm$^2$ and 70%, respectively.

EXAMPLE 4

0.6 g of I-4, 0.8 g of M-4, 0.03 g of S-4, 0.2 g of S-7, 0.1 g of S-8, 0.1 g of F-4 and 0.01 g of Z-4 were dissolved in 33.3 g of the solution of polyimide precursor (A4-1) prepared in Preparation 4 to obtain photosensitive composition (W-4). Its coating absorbance and viscosity were 1.5 and 38 P, respectively.

The obtained composition was applied on 3 inch silicon wafers by using a spin-coater, and dried to form 13 μm thick films. Using an i-line stepper FPA 2001 iI (manufactured by Canon Inc.), the films on the wafers were exposed through a patterned reticle at an exposure energy of 800 mJ/cm$^2$. Then, they were developed in a mixed solvent of cholinhydroxide, ethyl alcohol and water (0.5/0.5/90 vol. %) by means of puddle development. As a result, a sharp 10 μm line/space pattern was obtained.

The irradiated films on the wafers were heat-cured at 140° C. for 1 hr. and at 300° C. for 1 hr. under nitrogen atmosphere in a convection oven to form 7 μm thick polyimide films. The resultant films were broken at a pulling stress of 8 kg/mm² in both of the pull and water resistance test. They showed good adhesive strength and water resistance. The tensile strength and elongation of the polyimide films were 18 kg/mm² and 12%, respectively.

EXAMPLE 5

50 g of polyimide precursor (A5-1), 2 g of I-5, 3 g of M-5, 0.1 g of S-3, 0.5 g of S-9, 1 g of F-5 and 0.02 g of Z-4 were dissolved in 75 g of N-methylpyrrolidone to obtain photosensitive composition (W-5). Its coating absorbance and viscosity were 1.0 and 47.0 P, respectively.

The obtained composition was applied on 3 inch-thick silicon wafers by using a spin-coater, and dried to form 19 μm thick films. Using an i-line stepper FPA 2001 iI (manufactured by Canon Inc.), the films on the wafers were exposed through a patterned reticle at an exposure energy of 600 mJ/cm². Then, they were developed in a mixed solvent of cyclohexanone and xylene (70/30 vol. %), and rinsed with isopropyl alcohol. As a result a sharp 15 μm line/space pattern was obtained.

The irradiated films on the wafers were heat-cured at 140° C. for 1 hr. and at 350° C. for 2 hrs. under nitrogen atmosphere in a convection oven to obtain a 10 μm patterned polyimide films. The resultant films were broken at a pulling stress of 8 kg/mm² in both of the pull and water resistance tests. They showed good adhesive strength and water resistance. The tensile strength and elongation of the polyimide films were 18 kg/mm² and 18%, respectively.

EXAMPLES 6 to 18

50 g of various kinds of polyimide precursors shown in Table 9, 2 g of I-5, 3 g of M-5, 0.3 g of S-3, 0.5 g of S-9, 1 g of F-5 and 0.02 g of Z-4 were dissolved in 75 g of N-methylpyrrolidone to obtain photosensitive compositions (W-6 to W-18). Their coating absorbance and viscosity are shown in Table 9.

The obtained compositions were applied on 3 inch thick silicon wafers by using a spin-coater, and dried. The thickness of the resultant films is shown in Table 9. Using an i-line stepper FPA 2001 iI (manufactured by Canon Inc.), the films on the wafers were exposed through a patterned reticle at an exposure energy of 800 mJ/cm². Then, they were developed in a mixed solvent of cyclohexane and xylene (70/30 vol. %), and rinsed with isopropyl alcohol. The resultant resolution of the films is shown in Table 9.

The irradiated films on the wafers were heat-cured at 140° C. for 1 hr. and at 350° C. for 2 hrs. under nitrogen atmosphere in a convection oven to obtain polyimide patterned films having thickness shown in Table 9. The results of the pull and water resistance tests and the tensile strength and elongation of the polyimide films are shown in Table 9.

EXAMPLES 19 TO 26

Photosensitive compositions (W-19 to W-26) were prepared by the same method as in Example 3 except that various kinds of polyimide precursor solutions, which are shown in Table 10, prepared in Preparations 18 to 25 were employed instead of the polyimide precursor (A3-1). Their coating absorbance and viscosity are shown in Table 10.

Using these compositions, films were produced by the same method as in Example 3 and subjected to the same tests as in Example 3. The resolution of the patterned films, the results of the pull and water resistance tests, and the tensile strength and elongation of the polyimide films are shown in Table 10.

EXAMPLES 27 AND 28

50 g of a polyimide precursor shown in Table 10, 2 g of I-5, 3 g of M-5, 0.1 g of S-3, 0.5 g of S-9, 1 g of F-5 and 0.02 g of Z-4 were dissolved in 75 g of N-methylpyrrolidone to obtain photosensitive compositions (W-27 and W-28). Their coating absorbance and viscosity are shown in Table-10.

Using these compositions, films were produced by the same method as in Example 1 and subjected to the same tests as in Example 1. The resolution of the patterned films, the results of the pull and water resistance test, and the tensile strength and elongation of the polyimide films are shown in Table 10.

COMPARATIVE EXAMPLES 1 AND 2

50 g of a polyimide precursor shown in Table 10, 2 g of I-5, 3 g of M-5, 0.05 g of S-3, 0.5 g of S-9, 1 g of F-5 and 0.02 g of Z-4 were dissolved in 75 g of N-methylpyrrolidone to obtain photosensitive compositions (WR-1 and WR-2). Their coating absorbance and viscosity are shown in Table 10.

Using these compositions, films were produced by the same method as in Example 6. The resultant films in Comparative Example 1 did not have clear line because a cross-section of the line showed an inverse trapezoid having a sharp inclination so that they were not applicable to practical uses, neither were the resultant films in Comparative Example 2 because of an extremely sharp inclination. The results of the pull and water resistant tests, and the tensile strength, elongation and thickness of the polyimide films are shown in Table 10.

COMPARATIVE EXAMPLE 3

The general procedure of Comparative Example 1 was repeated except that polyimide precursor (A1-14) was used instead of polyimide precursor (A1-7) to prepare photosensitive composition (WR-3). Its coating absorbance and viscosity were 0.41 and 66.3 P, respectively.

The obtained composition was applied on 3 inch silicon wafers by using a spin-coater and dried to form 27 μm thick films. The resultant films produced by the same method as in Example 1 did not show line/space because irradiated areas were extremely swelled. On the other hand, the resultant films were broken at a pulling stress of 8 kg/mm² in both of the pull and water resistance tests. They showed good adhesive strength and water resistance. The tensile strength and elongation of the polyimide films were 9 kg/mm² and 120%, respectively.

EXAMPLE 29

50 g of polyimide precursor (A1-17), 2 g of I-1, 6 g of M-1, 0.05 g of S-1, 1 g of S-5, 1.5 g of S-10, 1 g of F-1 and 0.05 g of Z-1 were dissolved in 75 g of N-methylpyrrolidone to obtain photosensitive composition (W-29). Its coating absorbance and viscosity were 1.5 and 78 P, respectively.

Using the composition, 13 μm thick films were produced by the same method as in Example 1. Then, they were developed and rinsed with xylene to obtain a sharp 10 μm line/space pattern.

The irradiated films on the wafers were beat-cured under the same condition as in Example 1 to obtain 7 μm thick patterned polyimide films. The resultant films were broken at a pulling stress of 8 kg/mm² in both of the pull and water resistance test. They showed good adhesive strength and water resistance. The tensile strength and elongation of the polyimide films were 15 kg/mm² and 14%, respectively.

EXAMPLE 30

0.3 g of I-2, 0.5 g of M-2, 0.02 g of S-2, 0.1 g of S-9, 0.15 g of F-2 and 0.01 g of Z-2 were dissolved in 55.6 g of polyimide precursor (A2-2) to obtain photosensitive composition (W-30). Its coating absorbance and viscosity were 1.5 and 69 P, respectively.

Using the composition, 13 $\mu$m thick films were produced by the same method as in Example 2. Then, they were developed to obtain a sharp 10 $\mu$m line/space pattern.

The irradiated films on the wafers were heat-cured under the same condition as in Example 2 to obtain 7 $\mu$m thick patterned polyimide films. The resultant films were broken at a pulling stress of 5 to 6 kg/mm$^2$ in the pull test and at 3 kg/mm$^2$ or less in the water resistance test. The tensile strength and elongation of the polyimide films were 17 kg/mm$^2$ and 10%, respectively.

EXAMPLE 31

The general procedure in Example 3 was repeated except that polyimide precursor (A3-10) was used instead of polyimide precursor (A3-1) to prepare photosensitive composition (W-31). Its coating absorbance and viscosity was 1.4 and 50 P, respectively.

Using the composition, 17 $\mu$m thick films were produced by the same method as in Example 3. Then, they were developed to obtain a sharp 10 $\mu$m line/space pattern.

The irradiated films on the wafers were heat-cured under the same condition as in Example 3 to obtain 9 $\mu$m thick patterned polyimide films. The resultant films were broken at a pulling stress of 8 kg/mm$^2$ in both of the pull and water resistance test. They showed good adhesive strength and water resistance. The tensile strength and elongation of the polyimide films were 16 kg/mm$^2$ and 10%, respectively.

[Examples 32 to 36 and Comparative Examples 4 to 6]

Various kinds of polyimide precursors and other components shown in Table 11 were dissolved in 75 g of N-methylpyrrolidone to obtain photosensitive compositions (W-32 to W-36 and WR-4 to WR-6). Their coating absorbance and viscosity are shown in Table 12.

The obtained compositions were applied on 3 inch silicon wafers by using a spin-coater and dried. Thicknesses of the resultant films are shown in Table 12. Using an i-line stepper FPA 2001 iI (manufactured by Canon Inc.), the films on the wafers were exposed through a patterned reticle at an exposure energy shown in Table 11. Then, they were developed in a mixed solvent of cyclohexanone and xylene (70/30 vol. %) and rinsed with solvents shown in Table 11. The resultant films in the Examples showed sharp patterns. Their resolution is shown in Table 12.

The irradiated films on the wafers were heat-cured at 140° C. for 1 hr. and at 350° C. for 2 hrs. under nitrogen atmosphere in a convection oven. Thickness of the obtained polyimide films are shown in Table 12. The results of the pull and water resistance tests, and the tensile strength and elongation of the polyimide films are shown in Table 12.

EXAMPLES 37 TO 40

50 g of various kinds of a polyimide precursor shown in Table 13, 2 g of I-1, 6 g of M-1, 0.05 g of S-1, 1 g of S-5, 1.5 g of S-8, 1 g of F-1 and 0.05 g of Z-1 were dissolved in 75 g N-methylpyrrolidone to obtain photosensitive compositions (W-37 to W-40). Their coating absorbance and viscosity are shown in Table 13.

The obtained compositions were applied on 3 inch silicon wafers by using a spin-coater and dried. Thickness of the resultant films are shown in Table 13. Using an i-line stepper and exposure energy shown in Table 13, the films on the wafers were exposed through a patterned reticle. Then, they were developed by spraying a mixed solvent of γ-butyrolactone and xylene (50/50 vol. %) and rinsed with xylene. The resultant films showed sharp pattern profiles. Their resolution is shown in Table 13.

The irradiated films on the wafers were heat-cured at 140° C. for 1 hr. and at 300° C. for 1 hr. under nitrogen atmosphere in a convection oven to obtain polyimide patterned films having thickness shown in Table 13. The results of the pull and water resistance tests, and the tensile strength, elongation and thickness of the polyimide films are shown in Table 13.

EXAMPLES 41 AND 42

0.6 g of I-4, 0.8 g of M-4, 0.03 g of S-4, 0.2 g of S-7, 0.1 g of S-8, 0.1 g of F-4 and 0.01 g of Z-4 were dissolved in 33.3 g of polyimide precursor shown in Table 13 to obtain photosensitive compositions (W-41 and W-42). Their coating absorbance and viscosity are shown in Table 13.

Using these compositions, films were produced by the same method as in Example 4 except that an exposure energy of 500 mJ/cm$^2$ was employed. Both resultant films showed sharp pattern profiles.

The irradiated films of the wafers were heat-cured at 140° C. for 1 hr. and at 350° C. for 1 hr. under nitrogen atmosphere in a convection oven to obtain polyimide patterned films having a thickness shown in Table 13. The results of the pull and water resistance tests, and the tensile strength and elongation of the polyimide films are shown in Table 13.

EXAMPLES 43 TO 45

0.2 g of I-3, 0.8 g of M-3, 0.02 g of S-3, 0.3 g of S-6, 0.15 g of S-10, 0.1 g of F-3 and 0.01 g of Z-3 were dissolved in 77 g of polyimide precursor shown in Table 13 to obtain photosensitive compositions (W-43 to W-45). Their coating absorbance and viscosity are shown in Table 13.

The obtained compositions were applied on 3 inch silicon wafers by using a spin-coater and dried. Thickness of the resultant films is shown in Table 13. Using an i-line stepper, the films on the wafers were exposed through a patterned reticle at exposure energy shown in Table 13. Then, they were developed by spraying a mixed solvent of N,N'-dimethylacetamide and ethyl alcohol (80/20 vol. %) and rinsed with isopropyl alcohol. The resultant films showed sharp pattern profiles. Their resolution is shown in Table 13.

The irradiated films on the wafers were heat-cured at 140° C. for 1 hr. and at 350° C. for 1 hr. under nitrogen atmosphere in a convection oven to obtain polyimide patterned films having thickness shown in Table 13. The results of the pull and water resistance tests, and the tensile strength and elongation of the polyimide films are shown in Table 13.

EXAMPLE 46

50 g of polyimide precursor (A1-31), 2 g of I-1, 6 g of M-1, 0.05 g of S-1, 1 g of S-5, 1.5 g of S-10, 1 g of F-1 and 0.05 g of Z-1 were dissolved in 75 g of N-methylpyrrolidone to obtain photosensitive composition (W-46). Its coating absorbance and viscosity were 1.5 and 43 P, respectively.

The obtained composition was applied on 3 inch silicon wafers by using a spin-coater and dried to form 13 $\mu$m thick films. Using an i-line stepper NSR-1505 i7A (manufactured by Nikon Corporation), the films on the wafers were exposed through a patterned reticle at an exposure energy of 600 mJ/cm$^2$. Then, they were developed in a mixed solvent of γ-butyrolactone and xylene (50/50 vol. %) and rinsed with xylene. As a result, a sharp 10 μm line/space pattern was obtained.

The irradiated films on the wafers were heat-cured at 140° C. for 1 hr. and at 300° C. for 1 hr. under nitrogen atmosphere in a convection oven to obtain 7 μm thick patterned polyimide films. The resultant films were broken at a pulling stress of 8 kg/mm$^2$ in both of the pull and water resistance tests. They showed good adhesive strength and water resistance. The tensile strength and elongation of the polyimide films were 14 kg/cm$^2$ and 15%, respectively.

EXAMPLES 47 AND 48

50 g of polyimide precursor shown in Table 14, 2 g of I-5, 3 g of M-5, 0.1 g of S-3, 0.5 g of S-9, 1 g of F-5 and 0.02 g of Z-4 were dissolved in N-methylpyrrolidone to obtain photosensitive compositions (W-47 and W-48). Their coating absorbance and viscosity are shown in Table 14.

The obtained compositions were applied on 3 inch silicon wafers by using a spin-coater and dried. Thickness of the resultant films are shown in Table 14. Using an i-line stepper NSR-1505 i7A (manufactured by Nikon Corporation), the films on the wafers were exposed through a patterned reticle at an exposure energy of 500 mJ/cm$^2$ for W-47 and 600 mJ/cm$^2$ for W-48 with a mixed solvent of cyclohexanone and xylene (70/30 vol. %) by means of puddle development and rinsed with isopropyl alcohol. Both resultant films showed sharp pattern profiles. The resolution was shown in Table 14.

The irradiated films on the wafers were heat-cured at 140° C. for 1 hr. and at 350° C. for 1 hr. under nitrogen atmosphere in a convection oven to obtain polyimide patterned films having thickness shown in Table 14. The results of the pull and water resistance tests, and the tensile strength and elongation of polyimide films are shown in Table 14.

EXAMPLE 49

General procedure of Example 46 was repeated except that polyimide precursor (A1-34) was used instead of polyimide precursor (A1-31) to prepare photosensitive composition (W-49). Its coating absorbance and viscosity were 1.0 and 44 P, respectively.

Using this composition, 20 μm thick films were produced by the same method as in Example 46 except that an exposure energy of 200 mJ/mm$^2$ was used. Then, they were developed to obtain a sharp 15 μm line/space pattern.

The irradiated films on the wafers were heat-cured under the same condition as in Example 46. The resultant films were broken at a pulling stress of 8 kg/mm$^2$ in both of the pull and water resistance tests. They showed good adhesive strength and water resistance. The tensile strength and elongation of the polyimide films were 14 kg/mm$^2$ and 30%, respectively.

EXAMPLES 50 AND 51

50 g of polyimide precursor shown in Table 14, 2 g of I-5, 3 g of M-5, 0.1 g of S-3, 0.5 g of S-9, 1 g of F-5 and 0.02 g of Z-4 were dissolved in N-methylpyrrolidone to obtain photosenstive compositions (W-50 and W-51). Their coating absorbance and viscosity are shown in Table 14.

Using these compositions, films were produced by the same method as in Example 5 except for using an exposure energy of 200 mJ/cm$^2$ for W-50 and 500 mJ/cm$^2$ for W-51 to obtain sharp patterns. Their resolution is shown in Table 14.

The irradiated films on the wafers were heat-cured at 140° C. for 1 hr. and at 350° C. for 1 hr. under nitrogen atmosphere in a convection oven to obtain polyimide patterned films having thicknesses shown in Table 14. The results of the pull and water resistance tests, and the tensile strength and elongation of the polyimide films are shown in Table 14.

EXAMPLE 52

General procedure of Example 46 was repeated except that polyimide precursor (A1-37) was used instead of polyimide precursor (A1-31) and 80 g of N-methylpyrrolidone to prepare photosensitive composition (W-52). Its coating absorbance and viscosity were 1.2 and 30 P, respectively.

Using this composition, 13 μm thick films were produced by the same method as in Example 46. Then, they were developed to obtain a sharp 10 μm line/space pattern.

The irradiated films on the wafers were heat-cured under the same condition as in Example 46 to obtain 7 μm patterned polyimide films. The resultant films were broken at a pulling stress of 8 kg/mm$^2$ in both of the pull and water resistance tests. They showed good adhesion property and water resistance. The tensile strength and elongation of the polyimide films were 14 kg/mm$^2$ and 25%, respectively.

EXAMPLES 53 AND 54

General procedure of Example 6 was repeated except that various polyimide precursors shown in Table 15 were used to prepare photosensitive compositions (W-53 and W-54). Their coating absorbance and viscosity are shown in Table 15.

Using these compositions, films were prepared by the same method as in Example 6. The resolution of the obtained films, the results of the pull and water resistance tests, and the tensile strength and elongation are shown in Table 15.

COMPARATIVE EXAMPLE 7

General procedure of Example 6 was repeated except that polyimide precursor (A1-38) was used instead of polyimide precursor (A1-8) to prepare photosensitive composition (WR-7). Its coating absorbance and viscosity were 2.0 and 60.2 P, respectively.

Using the composition, 12 μm thick films were produced by the same method as in Example 6. After development, the films did not show clear line/space patterns because a cross-section of the line showed an inverse trapezoid having a sharp inclination. They were not workable.

The irradiated films were heat-cured by the same condition as in Example 6 to obtain 7 μm patterned polyimide films. The resultant films were broken at 5 kg/mm$^2$ in the pull test and at 3 kg/mm$^2$ or less in the water resistance test. The tensile strength and elongation of the polyimide films were 14 kg/mm$^2$ and 30%, respectively.

Tests for Other Physical Properties

Other physical properties of photosensitive compositions and polyimide films obtained therefrom were measured by the following methods. The results of these tests are shown in Tables 16–18.

(1) Preservation Stability Test

Photosensitive compositions(W-1 to W-54 and WR-1 to WR-7) prepared, respectively, in Examples 1 to 54 and Comparative Examples 1 to 7 were preserved in an oven at 40° C. for 5 days. Then, viscosity and patterning capacity of these compositions were measured and compared before and after preservation.

Evaluation

|  | Change in viscosity | Patterning capacity |
|---|---|---|
| ○ (good) | less than ±5% | Possible to apply and pattern under the same condition as before preservation. |
| Δ (usable) | ±15 to ±25% | Possible to apply and pattern when spin-coating conditions are adjusted. |
| x (poor) | more than ±25% | Impossible to apply and pattern. |

(2) Stability in Long Development

Photosensitive compositions (W-1 to W-54, WR-1 and WR-6) prepared, respectively, in Examples 1 to 54, Comparative Examples 1 and 6 were applied and exposed. Then, they were developed for a 30% longer period than each Example or Comparative Example and rinsed to obtain patterned films.

Evaluation

| ○ (good) | Sharp patterns were obtained. |
|---|---|
| Δ (usable) | Patterns were slightly swelled. |
| x (poor) | Exposed areas were partly swelled and dissolved, and did not have resolution. |

(3) Heat Resistance Test of Polyimide Films.

The polyimide films obtained from Examples 1 to 28 and Comparative Example 3 were (i) held in a solder bath at 280° C. for 20 sec., (ii) pressed with a metal lever heated at 300° C. for 2 sec. for observation.

Evaluation

| (i) | ○ (good) | No change was observed. |
|---|---|---|
|  | Δ (usable) | Shrunk and slightly swelled. |
|  | x (poor) | Dissolved and impossible to recover. |
| (ii) | ○ (good) | No big change was observed. |
|  | Δ (usable) | A mark of the lever was observed. |
|  | x (poor) | A hole was observed. |

(4) Elongation of the Polyimide Films

The polyimide films obtained from Examples 8, 27, 28, 30 and 54 and Comparative Examples 1, 2 and 7 were held in boiling water for 48 hrs. and dried in an oven at 50° C. for 2 hrs. Then, elongation of these films were measured and compared before and after boiling. Before boiling, the elongation of the films obtained from Examples 8, 27 and 30 were 90 %, 27% and 65%, respectively; after boiling those were 85%, 30% and 65%, respectively. Little change was observed. On the other hand, the elongation of the films obtained from Examples 30 and 54 were lowered from 10% and 30% to 5% or less and 15% or less, respectively. Those of Comparative Examples 1 and 7 were lowered from 30% to 22% and 10%, respectively. The elongation of the films obtained from Comparative Example 2 was lowered from 8% to 2% or less.

TABLE 9

| | Photosensitive composition | | | | Polyimide film | | | Line/space resolution ($\mu$m) | Pull test (kg/mm$^2$) | Water resistance test (kg/mm$^2$) |
|---|---|---|---|---|---|---|---|---|---|---|
| | | | | | Tensile | | | | | |
| Ex. | Polyimide precursor | Coating absorbance | Viscosity (poise) | Thickness ($\mu$m) | Strength (kg/mm$^2$) | Elongation (%) | Thickness ($\mu$m) | | | |
| 6 | W-6 | A1-2 | 1.42 | 135.0 | 16 | 18 | 59 | 8 | 15 | 8 | 8 |
| 7 | W-7 | A1-3 | 0.98 | 48.2 | 20 | 12 | 80 | 10 | 20 | 8 | 8 |
| 8 | W-8 | A1-4 | 1.35 | 125.2 | 18 | 13 | 90 | 10 | 15 | 8 | 8 |
| 9 | W-9 | A1-5 | 0.82 | 52.8 | 24 | 15 | 12 | 13 | 20 | 8 | 8 |
| 10 | W-10 | A1-6 | 0.89 | 63.0 | 23 | 18 | 12 | 13 | 20 | 8 | 8 |
| 11 | W-11 | A1-9 | 0.60 | 77.5 | 30 | 11 | 120 | 16 | 20 | 8 | 8 |
| 12 | W-12 | A1-10 | 0.89 | 69.3 | 23 | 13 | 20 | 12 | 20 | 8 | 8 |
| 13 | W-13 | A1-11 | 0.93 | 72.2 | 21 | 13 | 35 | 10 | 15 | 8 | 8 |
| 14 | W-14 | A1-12 | 0.83 | 48.3 | 22 | 12 | 35 | 12 | 20 | 8 | 8 |
| 15 | W-15 | A1-13 | 0.80 | 49.0 | 21 | 13 | 15 | 10 | 20 | 8 | 8 |
| 16 | W-16 | A5-2 | 1.03 | 52.2 | 22 | 18 | 22 | 11 | 20 | 8 | 8 |
| 17 | W-17 | A5-3 | 0.98 | 48.5 | 20 | 17 | 25 | 10 | 20 | 8 | 8 |
| 18 | W-18 | A5-4 | 0.89 | 49.5 | 22 | 15 | 28 | 11 | 20 | 8 | 8 |

TABLE 10

| | Photosensitive composition | | | | Polyimide film | | | Line/space resolution ($\mu$m) | Pull test (kg/mm$^2$) | Water resistance test (kg/mm$^2$) |
|---|---|---|---|---|---|---|---|---|---|---|
| | | | | | Tensile | | | | | |
| Ex. | Polyimide precursor | Coating absorbance | Viscosity (poise) | Thickness ($\mu$m) | Strength (kg/mm$^2$) | Elongation (%) | Thickness ($\mu$m) | | | |
| 19 | W-19 | A3-2 | 0.70 | 73.3 | 25 | 18 | 13 | 12 | 15 | 8 | 8 |
| 20 | W-20 | A3-3 | 1.30 | 68.3 | 18 | 15 | 35 | 8 | 15 | 8 | 8 |
| 21 | W-21 | A3-4 | 1.29 | 79.0 | 18 | 13 | 28 | 9 | 15 | 8 | 8 |
| 22 | W-22 | A3-5 | 1.12 | 53.2 | 20 | 16 | 20 | 9 | 15 | 8 | 8 |
| 23 | W-23 | A3-6 | 1.45 | 49.8 | 16 | 13 | 20 | 8 | 15 | 8 | 8 |

TABLE 10-continued

| | Photosensitive composition | | | | Polyimide film | | | Line/space resolution ($\mu$m) | Pull test (kg/mm$^2$) | Water resistance test (kg/mm$^2$) |
|---|---|---|---|---|---|---|---|---|---|---|
| | | | | | Tensile | | | | | |
| Ex. | Polyimide precursor | Coating absorbance | Viscosity (poise) | Thickness ($\mu$m) | Strength (kg/mm$^2$) | Elongation (%) | Thickness ($\mu$m) | | | |
| 24 | W-24 | A3-7 | 1.42 | 55.3 | 16 | 19 | 10 | 7 | 15 | 8 | 8 |
| 25 | W-25 | A3-8 | 0.82 | 59.0 | 22 | 15 | 14 | 10 | 20 | 8 | 8 |
| 26 | W-26 | A3-9 | 0.88 | 89.8 | 22 | 14 | 15 | 11 | 20 | 8 | 8 |
| 27 | W-27 | A1-15 | 0.89 | 85.3 | 21 | 12 | 28 | 11 | 15 | 8 | 8 |
| 28 | W-28 | A1-16 | 0.84 | 81.3 | 23 | 12 | 65 | 13 | 15 | 8 | 8 |
| Comp. Ex. 1 | WR-1 | A1-7 | 2.52 | 103.0 | 12 | 14 | 30 | 6 | N.D. | 8 | 4 |
| Comp. Ex. 2 | WR-2 | A1-8 | 6.10 | 98.0 | 12 | 10 | 8 | 6 | N.D. | 8 | N.D. |

N.D.: Not determined

TABLE 11

| | Component of photosensitiv composition | | | | | | | | |
|---|---|---|---|---|---|---|---|---|---|
| Ex. | Polyimide precursor | Photopolymer-ization initiator | C=C-containing compound | Sensitizer | | Adhesion promoter | Polymerization inhibitor | Exposure energy (mJ/cm$^2$) | Rinse |
| 32 | W-32 | A1-18 | 50 g | I-5  2 g | M-5  3 g | S-3 0.1 g<br>S-9 0.5 g | F-5  g | Z-4  0.02 | 600 | Isopropyl alcohol |
| 33 | W-33 | A1-19 | 50 g | " | " | S-3 0.1 g<br>S-9 0.5 g | " | " | 800 | Isopropyl alcohol |
| 34 | W-34 | A1-21 | 50 g | " | " | S-3 0.05 g<br>S-9 0.5 g | " | " | 400 | Xylene |
| 35 | W-35 | A1-22 | 50 g | " | " | S-3 0.1 g<br>S-9 0.5 g | " | " | 1000 | Isopropyl alcohol |
| 36 | W-36 | A1-23 | 50 g | " | " | S-3 0.1 g<br>S-9 0.5 g | " | " | 1200 | Isopropyl alcohol |
| Comp. Ex. 4 | WR-4 | A1-20 | 50 g | " | " | S-3 0.1 g<br>S-9 0.5 g | " | " | 500 | Isopropyl alcohol |
| Comp. Ex. 5 | WR-5 | A1-24 | 50 g | " | " | S-3 0.05 g<br>S-9 0.5 g | " | " | 400 | Xylene |
| Comp. Ex. 6 | WR-6 | A1-25 | 50 g | " | " | S-3 0.1 g<br>S-9 0.5 g | " | " | 700 | Isopropyl alcohol |

TABLE 12

| | Photosensitive composition | | | Polyimide film | | | | Pull test (kg/mm$^2$) | Water resistance test (kg/mm$^2$) |
|---|---|---|---|---|---|---|---|---|---|
| | | | | Tensile | | | | | |
| Ex. | Coating absorbance | Viscosity (poise) | Thickness ($\mu$m) | Strength (kg/mm$^2$) | Elongation (%) | Thickness ($\mu$m) | Line/space resolution ($\mu$m) | | |
| 32 | 1.1 | 43 | 18 | 15 | 22 | 10 | 15 | 8 | 8 |
| 33 | 1.4 | 59 | 14 | 18 | 17 | 8 | 8 | 8 | 8 |
| 34 | 1.5 | 43 | 12 | 17 | 10 | 6 | 10 | 5–6 | 4 |
| 35 | 0.97 | 49 | 21 | 13 | 10 | 11 | 20 | 8 | 8 |
| 36 | 0.85 | 38 | 22 | 12 | 18 | 12 | 20 | 8 | 8 |
| Comp. Ex. 4 | 1.2 | 39 | 17 | 14 | 28 | 7 | Resolved at 15 $\mu$m. The film thickness after development reduced to 12 $\mu$m. Residual is slightly attached to the unirradiated part in the form of sponge. | 1 or less | — |
| Comp. Ex. 5 | 2.1 | 70 | 12 | — | — | — | A clear 20 $\mu$m line/space pattern is not obtained because a cross-section of the line showed an inverse trapezoid having a sharp inclination. | 5–6 | 4 |
| Comp. Ex. 6 | 0.73 | 49 | 27 | 16 | 14 | 11 | Resolved at 40 $\mu$m. The 30 $\mu$m line was swelled. The film thickness after development reduced to 19 $\mu$m. Residual is slightly attached to the | 1 or less | — |

TABLE 12-continued

| | Photosensitive composition | | | Polyimide film | | | | Pull | Water resistance |
| | | | | Tensile | | | | test | test |
| Ex. | Coating absorbance | Viscosity (poise) | Thickness (μm) | Strength (kg/mm$^2$) | Elongation (%) | Thickness (μm) | Line/space resolution (μm) | (kg/mm$^2$) | (kg/mm$^2$) |
|---|---|---|---|---|---|---|---|---|---|
| | | | | | | | unirradiated part in the form of sponge. | | |

TABLE 13

| | | Photosensitive composition | | | Exposure | Polyimide film | | | Line/space | Full | Water resistance |
| | | | | | | Tensile | | | | | |
| Ex. | | Polyimide precursor | Coating absorbance | Viscosity (poise) | Thickness (μm) | energy (mJ/cm$^2$) | Strength (kg/mm$^2$) | Elongation (%) | Thickness (μm) | resolution (μm) | test (kg/mm$^2$) | test (kg/mm$^2$) |
|---|---|---|---|---|---|---|---|---|---|---|---|---|
| 37 | W-37 | A1-26 | 1.3 | 56 | 13 | 600*$^1$ | 15 | 16 | 7 | 10 | 8 | 8 |
| 38 | W-38 | A1-28 | 1.2 | 42 | 13 | 700*$^2$ | 15 | 14 | 7 | 10 | 8 | 8 |
| 39 | W-39 | A1-29 | 1.4 | 40 | 13 | 600*$^2$ | 14 | 12 | 7 | 15 | 8 | 8 |
| 40 | W-40 | A1-30 | 1.5 | 52 | 13 | 500*$^2$ | 15 | 16 | 7 | 15 | 8 | 8 |
| 41 | W-41 | A4-2 | 1.5 | 30 | 13 | 500*$^1$ | 15 | 25 | 7 | 20 | 8 | 8 |
| 42 | W-42 | A4-3 | 1.1 | 28 | 13 | 500*$^1$ | 16 | 20 | 7 | 20 | 8 | 8 |
| 43 | W-43 | A3-11 | 1.1 | 33 | 13 | 500*$^1$ | 15 | 20 | 7 | 10 | 8 | 8 |
| 44 | W-44 | A3-12 | 1.1 | 35 | 13 | 600*$^1$ | 15 | 14 | 7 | 10 | 8 | 8 |
| 45 | W-45 | A3-13 | 1.1 | 39 | 13 | 500*$^1$ | 14 | 21 | 7 | 10 | 8 | 8 |

*$^1$: i-line stepper FPA 2001 iI (manufactured by Canon Inc.)
*$^2$: i-line stepper NSR-1505 i7A (manufactured by Nikon Corporation)

TABLE 14

| | | Photosensitive composition | | | | Polyimide film | | | Line/space | Pull | Water resistance |
| | | | N-methyl pyrrolidone | | | | Tensile | | | resolution | test | test |
| Ex. | | Polyimide precursor | (g) | Coating absorbance | Viscosity (poise) | Thickness (μm) | Strength (kg/mm$^2$) | Elongation (%) | Thickness (μm) | (μm) | (kg/mm$^2$) | (kg/mm$^2$) |
|---|---|---|---|---|---|---|---|---|---|---|---|---|
| 47 | W-47 | A1-32 | 80 | 0.9 | 41 | 24 | 15 | 30 | 12 | 20 | 5–6 | 3 or less |
| 48 | W-48 | A1-33 | 70 | 1.4 | 49 | 13 | 20 | 14 | 7 | 15 | 5–6 | 3 or less |
| 50 | W-50 | A1-35 | 70 | 0.6 | 39 | 24 | 14 | 35 | 12 | 20 | 5–6 | 3 or less |
| 51 | W-51 | A1-36 | 80 | 0.9 | 34 | 16 | 14 | 85 | 9 | 20 | 8 | 8 |

TABLE 15

| | | Photosensitive composition | | | Polyimide film | | | Line/space | Pull | Water resistance |
| | | | | | Tensile | | | resolution | test | test |
| Ex. | | Polyimide precursor | Coating absorbance | Viscosity (poise) | Thickness (μm) | Strength (kg/mm$^2$) | Elongation (%) | Thickness (μm) | (μm) | (kg/mm$^2$) | (kg/mm$^2$) |
|---|---|---|---|---|---|---|---|---|---|---|---|
| 53 | W-53 | A5-5 | 0.5 | 68 | 25 | 14 | 20 | 13 | 25 | 8 | 8 |
| 54 | W-54 | A5-6 | 1.1 | 73 | 18 | 14 | 30 | 10 | 20 | 8 | 8 |

TABLE 16

| Ex. | Thermal stability of composition | Long development | Heat resistance of polyimide film (i) | (ii) |
|---|---|---|---|---|
| 1 | 5% or less | ○ | ○ | ○ |
| 2 | +20% | Δ | ○ | Δ |
| 3 | N.D. | x | Δ | ○ |
| 4 | −15% | Δ | ○ | Δ |
| 5 | 5% or less | ○ | ○ | ○ |
| 6 | 5% or less | ○ | ○ | ○ |
| 7 | 5% or less | ○ | ○ | ○ |
| 8 | 5% or less | ○ | ○ | ○ |

TABLE 16-continued

| Ex. | Thermal stability of composition | Long development | Heat resistance of polyimide film (i) | (ii) |
|---|---|---|---|---|
| 9 | 5% or less | ○ | ○ | ○ |
| 10 | 5% or less | ○ | ○ | ○ |
| 11 | 5% or less | ○ | Δ | Δ |
| 12 | 5% or less | ○ | ○ | ○ |
| 13 | 5% or less | ○ | ○ | ○ |
| 14 | 5% or less | ○ | ○ | ○ |
| 15 | 5% or less | ○ | ○ | ○ |
| 16 | 5% or less | ○ | ○ | Δ |
| 17 | 5% or less | ○ | ○ | Δ |
| 18 | 5% or less | ○ | Δ | Δ |
| 19 | N.D. | x | ○ | ○ |
| 20 | N.D. | x | ○ | ○ |
| 21 | N.D. | x | ○ | ○ |
| 22 | N.D. | x | ○ | ○ |
| 23 | N.D. | x | ○ | ○ |
| 24 | N.D. | x | ○ | ○ |
| 25 | N.D. | x | ○ | ○ |

TABLE 17

| Ex. | Thermal stability of composition | Long development | Heat resistance of polyimide film (i) | (ii) |
|---|---|---|---|---|
| 26 | N.D. | x | ○ | ○ |
| 27 | 5% or less | ○ | ○ | ○ |
| 28 | 5% or less | ○ | ○ | Δ |
| 29 | 5% or less | ○ | — | — |
| 30 | +25% | Δ | — | — |
| 31 | N.D. | x | — | — |
| 32 | 5% or less | ○ | — | — |
| 33 | 5% or less | ○ | — | — |
| 34 | 5% or less | ○ | — | — |
| 35 | 5% or less | ○ | — | — |
| 36 | 5% or less | ○ | — | — |
| 37 | 5% or less | ○ | — | — |
| 38 | 5% or less | ○ | — | — |
| 39 | 5% or less | ○ | ○ | Δ |
| 40 | 5% or less | ○ | — | — |
| 41 | −20% | Δ | — | — |
| 42 | −15% | Δ | ○ | Δ |
| 43 | N.D. | x | — | — |
| 44 | N.D. | x | — | — |
| 45 | N.D. | x | — | — |
| 46 | 5% or less | ○ | — | — |
| 47 | 5% or less | ○ | — | — |
| 48 | 5% or less | ○ | — | — |
| 49 | 5% or less | ○ | — | — |
| 50 | 5% or less | ○ | — | — |

TABLE 18

| Ex. | Thermal stability of composition | Long development | Heat resistance of polyimide film (i) | (ii) |
|---|---|---|---|---|
| 51 | 5% or less | ○ | ○ | Δ |
| 52 | 5% or less | ○ | — | — |
| 53 | 5% or less | ○ | ○ | Δ |
| 54 | 5% or less | ○ | ○ | Δ |
| Comp. Ex. 1 | 5% or less | — | — | — |
| Comp. Ex. 2 | 5% or less | — | — | — |
| Comp. Ex. 3 | 5% or less | — | x | x |
| Comp. Ex. 4 | 5% or less | x*1 | — | — |
| Comp. Ex. 5 | 5% or less | — | — | — |
| Comp. Ex. 6 | 5% or less | x*2 | — | — |
| Comp. Ex. 7 | 5% or less | — | — | — |

*1: The film thickness reduced to 9 mm.
*2: The films thickness reduced to 15 mm.
—: Not measured.

What is claimed is:

1. A process for forming a polyimide pattern which comprises the steps of:

(1) selecting a polymeric polyimide precursor which has an amide bond density of at least 1.5 mol/kg from the group consisting of polymeric aromatic polyimide precursors which have a repeating unit represented by the formula

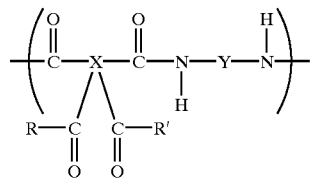

wherein

X is an unfluorinated aromatic ring bonded to at least four substituents, or an unfluorinated structure bonded to at least four substituents that is composed of up to a total of four aromatic rings linked to each other via single bonds, and wherein X further comprises an electron-donating group lacking hydrogen, which is an aryloxy group, and is attached to the aromatic ring bonded to the CONH substituent;

—COR and —COR' are substituents that occupy the ortho positions of aromatic ring X with respect to the CONH substituent;

R and R' are $OR_1$ wherein $R_1$ is a group containing a carbon-carbon double bond; and Y is an unfluorinated aromatic ring, bonded to at least two substituents, or an unfluorinated structure, bonded to at least two substituents, that is composed of up to a total of six aromatic rings linked together via bonds to at least one type of linker selected from the group consisting of O, S, CO, $CH_2$, $(CH_3)_2C$, SO, $SO_2$ and a single bond;

(2) applying a film of a photosensitive composition, which comprises the polymeric polyimide precursor, a photopolymerization initiator and a solvent and which, at a thickness of 10 μm, exhibits an absorbance of 1.5 or less upon exposure to light of wavelength of 365 nm, to an article capable of being covered by the film;

(3) exposing the applied film to monochromatic i-line light by using an i-line stepper;

(4) removing unexposed areas of the film with a developing solution to form a pattern; and (5) heat-curing the resultant pattern.

2. The process for forming a polyimide pattern according to claim 1, the photomerization initiator is an oxime derivatives and is present in an amount of from about 1 to about 15 parts by weight per 100 parts by weight of the polyimide precursor.

* * * * *